United States Patent
Kim et al.

(10) Patent No.: US 12,033,988 B2
(45) Date of Patent: Jul. 9, 2024

(54) APPARATUS FOR SEPARATING SEMICONDUCTOR ELEMENTS AND METHOD FOR FABRICATING LIGHT-EMITTING ELEMENTS USING THE SAME

(71) Applicant: Samsung Display Co., LTD., Yongin-si (KR)

(72) Inventors: In Hyuk Kim, Hwaseong-si (KR); Dong Gyun Kim, Seoul (KR); Jae Hoon Jung, Seoul (KR); Jin Oh Kwag, Yongin-si (KR); Hee Yeon Yoo, Hwaseong-si (KR); Sung Chan Jo, Seoul (KR); Jeong In Choi, Asan-si (KR); Hye Jung Hong, Cheonan-si (KR); Jong Hyuk Kang, Suwon-si (KR); Dong Eon Lee, Hwaseong-si (KR); Hyun Min Cho, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 260 days.

(21) Appl. No.: 17/382,825

(22) Filed: Jul. 22, 2021

(65) Prior Publication Data
US 2022/0037292 A1    Feb. 3, 2022

(30) Foreign Application Priority Data

Jul. 28, 2020   (KR) ................. 10-2020-0093975

(51) Int. Cl.
*H01L 25/075*  (2006.01)
*H01L 21/68*   (2006.01)
(Continued)

(52) U.S. Cl.
CPC .......... *H01L 25/0753* (2013.01); *H01L 21/68* (2013.01); *H01L 21/7806* (2013.01); *H01L 33/005* (2013.01)

(58) Field of Classification Search
CPC . H01L 25/0753; H01L 21/68; H01L 21/7806; H01L 33/005; H01L 2221/68381;
(Continued)

(56) References Cited

U.S. PATENT DOCUMENTS 9,329,433 B2   5/2016   Negishi et al.
9,847,243 B2  12/2017   Carre et al.
(Continued)

FOREIGN PATENT DOCUMENTS

JP   2004-55629   2/2004
JP   2010-13324   1/2010
(Continued)

OTHER PUBLICATIONS

International Search Report corresponding to International Application No. PCT/KR2021/009634 dated Nov. 1, 2021.
(Continued)

*Primary Examiner* — Ratisha Mehta
(74) *Attorney, Agent, or Firm* — KILE PARK REED & HOUTTEMAN PLLC

(57) ABSTRACT

An apparatus includes a base including a receiving portion that receives a substrate on which semiconductor elements are disposed; and at least one ultrasonic generator that generates and applies ultrasonic waves to the substrate placed in the base.

14 Claims, 42 Drawing Sheets

(51) Int. Cl.
*H01L 21/78* (2006.01)
*H01L 33/00* (2010.01)

(58) Field of Classification Search
CPC ......... H01L 21/67144; H01L 21/67207; H01L 21/6835; H01L 21/78; H01L 33/0095; H01L 21/67132
See application file for complete search history.

(56) References Cited

U.S. PATENT DOCUMENTS

| | | | | |
|---|---|---|---|---|
| 2007/0207710 | A1* | 9/2007 | Montierth | A61B 8/546 451/104 |
| 2012/0056511 | A1* | 3/2012 | Sakai | G10K 9/122 310/334 |

FOREIGN PATENT DOCUMENTS

| | | |
|---|---|---|
| JP | 4413478 | 2/2010 |
| JP | 4472238 | 6/2010 |
| JP | 2011-121154 | 6/2011 |
| JP | 4912454 | 4/2012 |
| JP | 4965293 | 7/2012 |
| JP | 5014477 | 8/2012 |
| KR | 10-2009-0019510 | 2/2009 |
| KR | 10-2012-0061923 | 6/2012 |
| KR | 10-2012-0138805 | 12/2012 |
| KR | 10-2016-0011286 | 2/2016 |
| KR | 10-1862322 | 5/2018 |

OTHER PUBLICATIONS

Written Opinion corresponding to International Application No. PCT/KR2021/009634 dated Nov. 1, 2021.

* cited by examiner

FIG. 6
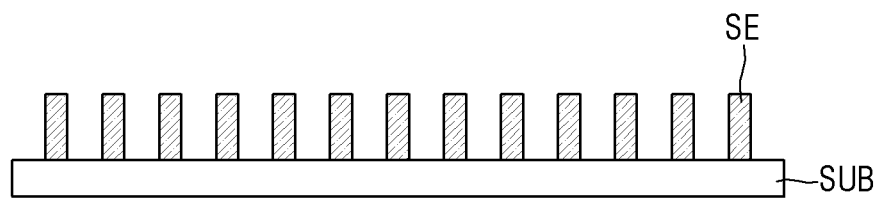
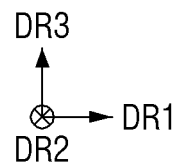

APPARATUS FOR SEPARATING SEMICONDUCTOR ELEMENTS AND METHOD FOR FABRICATING LIGHT-EMITTING ELEMENTS USING THE SAME

CROSS-REFERENCE TO RELATED APPLICATION(S)

This application claims priority to and benefits of Korean Patent Application No. 10-2020-0093975 under 35 U.S.C. § 119, filed on Jul. 28, 2020 in the Korean Intellectual Property Office, the entire contents of which are incorporated herein by reference.

BACKGROUND

1. Technical Field

The disclosure relates to an apparatus for separating semiconductor elements and a method for fabricating light-emitting elements using the same. The disclosure relates to an apparatus for separating semiconductor elements formed on a substrate from the substrate using ultrasonic waves, and a method for fabricating light-emitting elements.

2. Description of the Related Art

Display devices become more and more important as multimedia technology evolves. Accordingly, a variety of types of display devices such as organic light-emitting display (OLED) devices and liquid-crystal display (LCD) devices are currently used.

Display devices are for displaying images and may include a display panel such as an organic light-emitting display panel or a liquid-crystal display panel. Among them, the light-emitting display panel may include light-emitting elements. For example, light-emitting diodes (LEDs) may include an organic light-emitting diode (OLED) using an organic material as a fluorescent material, and an inorganic light-emitting diode using an inorganic material as a fluorescent material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Inorganic light-emitting elements may be produced by epitaxial growth in which semiconductor crystals are grown on a wafer substrate. By way of example, a plurality of semiconductor layers may be grown on the wafer substrate, and then they are separated from the wafer substrate, to produce inorganic light-emitting elements. In doing so, the inorganic light-emitting elements grown on the substrate may be separated from the substrate upon the application of a mechanical force.

Unfortunately, such a process of using mechanical force is carried out manually by an operator, and thus this process may take a long time. Additionally, the process time and the cut surfaces of the separated inorganic light-emitting elements may not be uniform depending on the operator's skill level, and the inorganic light-emitting elements may be damaged.

Aspects of the disclosure provide an apparatus for separating semiconductor elements formed on a substrate by using ultrasonic waves.

Aspects of the disclosure also provide a method for fabricating light-emitting elements by using the apparatus for separating semiconductor elements, exhibiting excellent quality of the light-emitting elements and reducing process time.

It should be noted that objects of the disclosure are not limited to the above-mentioned objects, and other objects of the disclosure will be apparent to those skilled in the art from the following descriptions.

According to an embodiment, semiconductor elements formed on a substrate may be separated by using ultrasonic waves, so that the separation surfaces of the separated semiconductor elements may be neat or uniform as compared to separation surfaces using mechanical force. Thus, deviations in length of the semiconductor elements may be reduced or minimized.

For example, light-emitting elements of uniform quality may be fabricated by using the apparatus for separating semiconductor elements, and the reliability of a device including the same may be improved.

It should be noted that effects of the disclosure are not limited to those described above and other effects of the disclosure will be apparent to those skilled in the art from the following descriptions.

According to an embodiment, an apparatus may include a base comprising a receiving portion that receives a substrate on which semiconductor elements are formed; and at least one ultrasonic generator that generates and applies ultrasonic waves to the substrate placed in the base.

The apparatus may include at least one ultrasonic generator that may comprise a first ultrasonic generator disposed at a bottom of the base, and the first ultrasonic generator may generate ultrasonic waves in a direction perpendicular to a lower surface of the receiving portion of the base.

The base may comprise sidewalls surrounding the receiving portion, the at least one ultrasonic generator may further comprise second ultrasonic generators disposed on sidewalls of the base in a first direction and third ultrasonic generators disposed on sidewalls in a second direction in a plan view, and the second ultrasonic generators and the third ultrasonic generators may generate ultrasonic waves in a direction horizontal to the lower surface of the base.

The bottom of the base may comprise a portion on which the first ultrasonic generator may be disposed; and an inclined portion connecting the portion on which the first ultrasonic generator may be disposed with a sidewall, and the at least one ultrasonic generator may further comprise a fourth ultrasonic generator disposed on the inclined portion of the base.

The at least one ultrasonic generator may further comprise fifth ultrasonic generators disposed in the receiving portion of the base.

The at least one ultrasonic generator may be a probe ultrasonic generator that selectively generates and applies ultrasonic waves to a number of regions of the substrate, the probe ultrasonic generator being separated from the base, and the probe ultrasonic generator may generate and apply ultrasonic waves in a direction perpendicular to a surface of the substrate on which the semiconductor elements are formed.

The probe ultrasonic generator may move in at least one direction on the base.

The apparatus may further comprise a stage on which the base may be disposed; and a gantry unit on which the probe ultrasonic generator may be disposed above the stage, wherein the probe ultrasonic generator may generate and apply ultrasonic waves to the substrate while the base is moving on the stage.

The apparatus may further comprise a first inlet pipe connected to a side of the receiving portion of the base, and a second inlet pipe connected to another side of the receiving portion of the base, wherein the first inlet pipe may introduce a solvent into the receiving portion of the base, and the second inlet pipe may discharge the solvent and the semiconductor elements.

The apparatus may further comprise a filter part connected to the first inlet pipe and the second inlet pipe; a first filter disposed between the filter part and the first inlet pipe; and a second filter disposed between the filter part and the second inlet pipe, wherein the first filter may filter out particles of a size smaller than particles that the second filter filters.

The apparatus may further comprise a valve connected to the filter part to discharge the solvent and the semiconductor elements introduced into the filter part.

The apparatus may further comprise a measurement unit that measures a degree of separation from the substrate from which the semiconductor elements have been separated.

According to an embodiment, a method for manufacturing light-emitting elements, the method may include preparing at least one substrate on which light-emitting elements having a shape extended in one direction may be formed; and placing the at least one substrate in a receiving portion containing a solvent; separating the light-emitting elements from the at least one substrate by applying ultrasonic waves to the at least one substrate; and removing the at least one substrate from the receiving portion and separating the light-emitting elements from the solvent.

The at least one substrate may comprise a plurality of substrates placed in the receiving portion, and the ultrasonic waves may be applied in a direction perpendicular or horizontal to a surface of the at least one substrate.

The plurality of substrates may be arranged so that surfaces on which the light-emitting elements are formed face in different directions.

The plurality of substrates may be placed in a direction perpendicular to a lower surface of the receiving portion, and the separating of the light-emitting elements from the at least one substrate may further comprise rotating the plurality of substrates with respect to a central axis of the plurality of substrates.

The ultrasonic waves may be applied through a probe ultrasonic generator that selectively generates and applies the ultrasonic waves to a number of regions on the at least one substrate of the plurality of substrates, and the separating of the light-emitting elements from the at least one substrate may comprise applying the ultrasonic waves as the probe ultrasonic generator moves above the at least one substrate of the plurality of substrates.

The separating of the light-emitting elements from the at least one substrate may comprise applying the ultrasonic waves while the at least one substrate of the plurality of substrates moves in a direction.

Defective elements distinguished from the light-emitting elements may be further formed on the at least one substrate of the plurality of substrates, and the separating of the light-emitting elements from the at least one substrate may be carried out after selectively separating the defective elements.

The light-emitting elements may comprise a first semiconductor layer, a second semiconductor layer, and an emissive layer disposed between the first semiconductor layer and the second semiconductor layer, and the first semiconductor layer, the emissive layer, and the second semiconductor layer may be arranged along the one direction.

BRIEF DESCRIPTION OF THE DRAWINGS

The above and other aspects and features of the disclosure will become more apparent by describing in detail embodiments thereof with reference to the attached drawings, in which:

FIGS. 6 to 9 are schematic diagrams showing processing steps of fabricating semiconductor elements in sequence according to an embodiment.

DETAILED DESCRIPTION OF THE EMBODIMENTS

Figure 1:
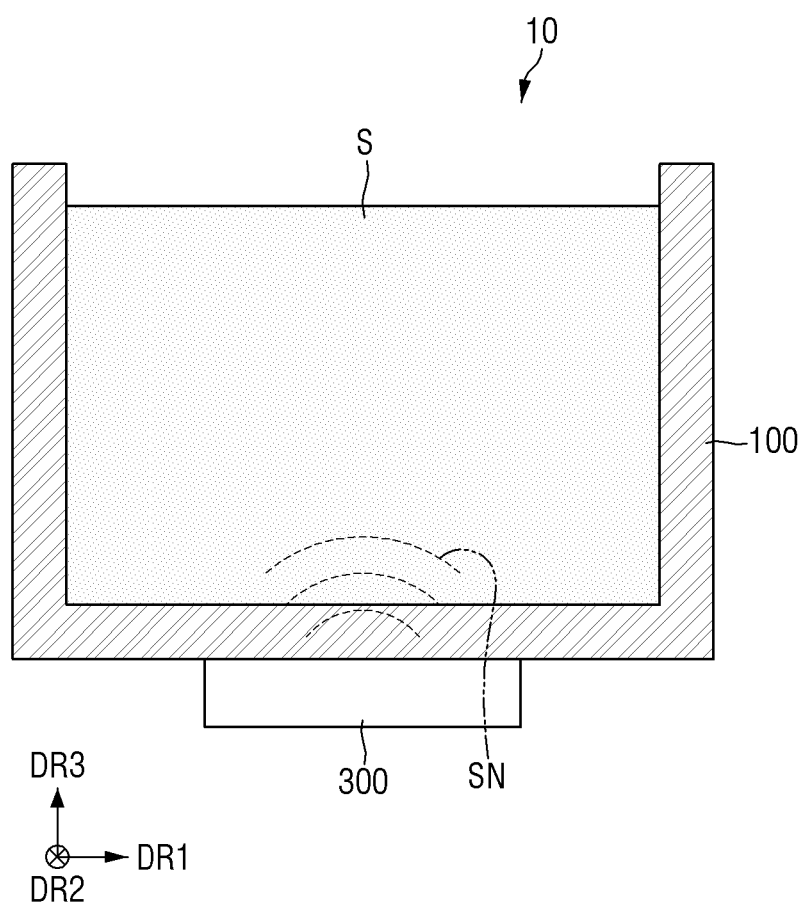
FIG. 1 is a schematic diagram showing an apparatus for separating semiconductor elements according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it may be directly on the other layer or substrate, or intervening layers may also be present. The same reference numbers indicate the same components throughout the specification.

In the disclosure, it will be understood that when an element or layer is referred to as being "on", "connected to" or "coupled to" another element or layer, it may be directly on, connected or coupled to the other element or layer or intervening elements or layers may be present.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

As used herein, the singular forms, "a", "an" and "the" are intended to include the plural forms as well, unless the context clearly indicates otherwise.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be further understood that the terms "comprises" and/or "comprising", "includes" and/or "including", "has", "have" and/or "having" and their variations when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

Figure 2:
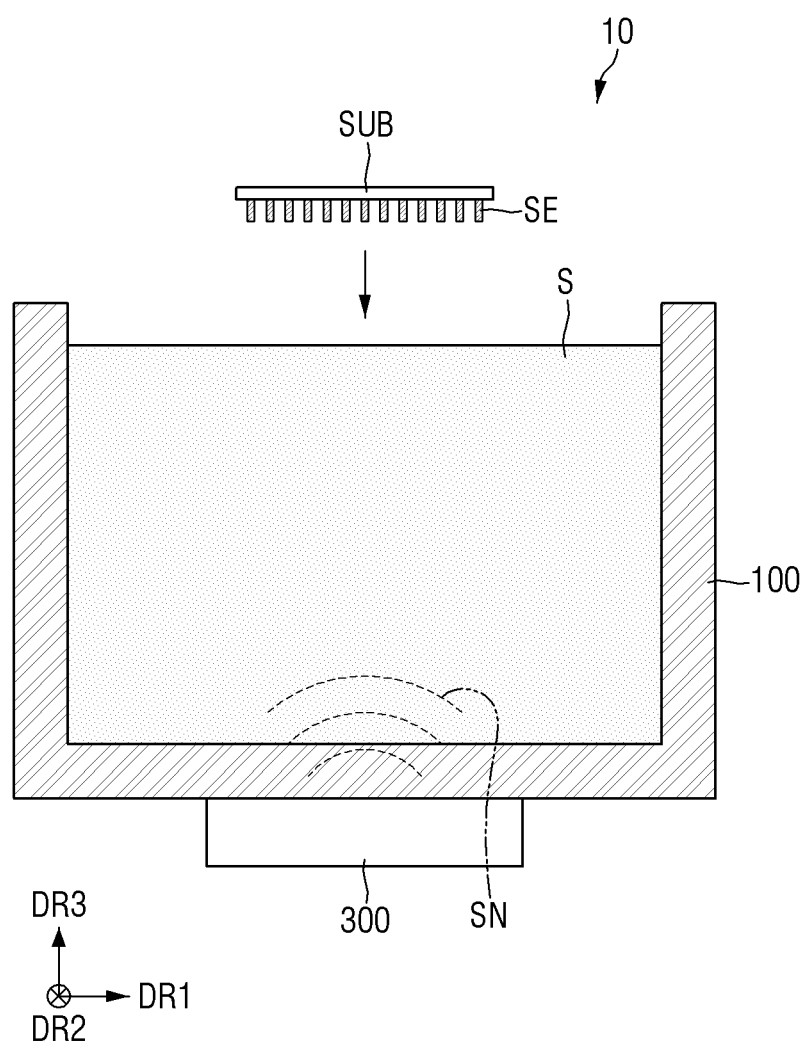
FIGS. 2 and 3 are schematic diagrams showing a process of separating semiconductor elements from a substrate using the apparatus for separating semiconductor elements of FIG. 1.
Figure 3:
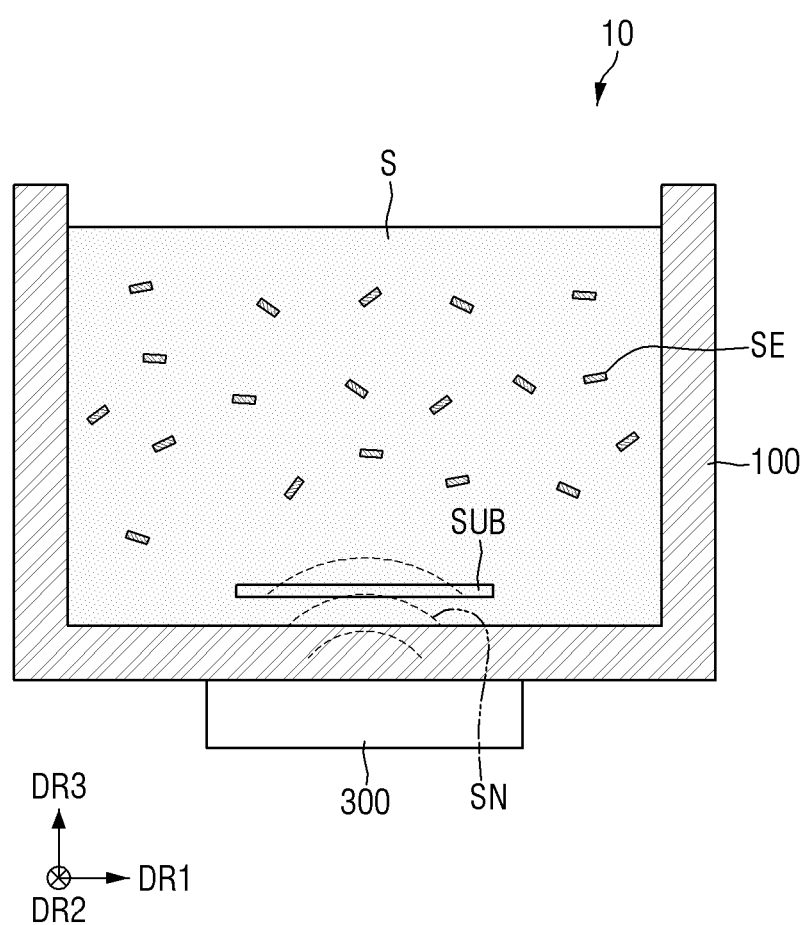

FIG. 1 is a schematic diagram showing an apparatus for fabricating semiconductor elements according to an embodiment. FIGS. 2 and 3 are schematic diagrams showing a process of separating semiconductor elements from a substrate using the apparatus for separating semiconductor elements of FIG. 1.

As used herein, the terms "above," "top" and "upper surface" refer to the upper side of the apparatus for separating semiconductor elements 10, for example, the side indicated by the arrow in the third direction DR3, whereas the terms "below," "bottom" and "lower surface" refer to the opposite side in the third direction DR3. As used herein, the terms "left," "right," "upper" and "lower" sides indicate relative positions when the apparatus for separating semiconductor elements 10 is viewed from the top. For example, the "left side" refers to the opposite of the first direction DR1, the "right side" refers to the side indicated by the arrow of the first direction DR1, the "upper side" refers to the side indicated by the arrow of the second direction DR2, and the "lower side" refers to the opposite of the second direction DR2.

Referring to FIGS. 1 to 3, the apparatus 10 may include a base 100 and at least one ultrasonic generator 300. According to an embodiment, in a case that a substrate SUB having semiconductor elements SE formed thereon is placed in the base 100, the apparatus 10 may generate ultrasonic waves SN in the base 100 to separate the semiconductor elements SE from the substrate SUB.

The base 100 can provide a space in which a process of separating the semiconductor elements SE from the substrate SUB is carried out. For example, the base 100 may include a flat lower surface and may include sidewalls having a predetermined height so that a space for a receiving portion or a chamber in which the substrate SUB is placed is formed. It is, however, to be understood that the disclosure is not limited thereto. In some implementations, the shape of the base 100 may vary depending on the conditions and methods in which the process of separating the semiconductor elements SE is carried out. The base 100 may be made of a rigid material so that the exterior is not deformed by the ultrasonic waves generated by the ultrasonic generator 300. For example, the base 100 may be made of, but is not limited to, a metal material.

A solvent S may be prepared in an inner space or a receiving portion surrounded by the sidewalls of the base 100. In order to prevent the semiconductor elements SE separated from the substrate SUB from sinking on the lower surface of the receiving portion of the base 100, the solvent S may be prepared in the receiving portion of the base 100 and the process of separating the semiconductor elements SE may be performed in the solvent S. The semiconductor elements SE separated from the substrate SUB may be dispersed in the solvent S, and may be separated from the solvent S in a subsequent process. Various kinds of materials may be employed as the solvent S as long as it neither reacts with the semiconductor elements SE nor deforms the semiconductor elements SE. For example, the solvent S may be, but is not limited to, acetone, water, alcohol, toluene, propylene glycol (PG) or propylene glycol methyl acetate (PGMA), triethylene glycol monobutyl ether (TGPE), diethylene glycol monophenyl ether (DGPE), amide solvent, dicarbonyl solvent, diethylene glycol dibenzoate, tricarbonyl solvent, triethyl citrate, a phthalate solvent, benzyl butyl phthalate, bis(2-ethylhexyl) phthalate, bis(2-ethylhexyl) isophthalate, ethyl phthalyl ethyl glycolate. The solvent S may be either a material that does not react with the semiconductor elements SE or may be a material that facilitates the separation of the semiconductor elements SE from the substrate SUB.

The ultrasonic generator 300 may generate or apply ultrasonic waves SN in the space formed by the base 100. The ultrasonic generator 300 may be disposed on the base 100 or may be implemented as a separate element from the base 100. For example, similar to an embodiment shown in FIG. 1, the ultrasonic generator 300 may be disposed directly on the bottom of the base 100 to generate ultrasonic waves SN in the space through the base 100. It is, however, to be understood that the disclosure is not limited thereto. The ultrasonic generator 300 may be disposed on the sidewalls of the base 100 or may be disposed in the inner space of the base 100. Alternatively, the ultrasonic generator 300 may be separated from the base 100 as a separate element. According to an embodiment, the ultrasonic generator 300 may be an ultrasonic transducer that converts electrical energy into mechanical vibrations. Although not shown in the drawings, the apparatus 10 may be electrically connected to a device that applies voltage. The ultrasonic generator 300 may convert the voltage into ultrasonic waves SN in a case that the voltage may be applied.

The semiconductor elements SE may be spaced apart from each other on the substrate SUB. According to an embodiment, the semiconductor elements SE may be extended in a direction on a surface of the substrate SUB. One or a side of each of the semiconductor elements SE may be connected to the substrate SUB. In a case that the semiconductor elements SE connected to the substrate SUB are disposed in the base 100 in which the solvent S is prepared, the ultrasonic generator 300 applies ultrasonic waves SN to the inside of the base 100. The substrate SUB may be orientated so that its surface on which the semiconductor elements SE are formed faces the ultrasonic generator 300, but the disclosure is not limited thereto. The substrate SUB may be oriented in the opposite direction or may be orientated perpendicularly to the upper surface of the receiving portion. The ultrasonic waves SN may be transmitted to the substrate SUB on which the semiconductor elements SE are formed through the base 100 and the solvent S. The semiconductor elements SE may be separated from the substrate SUB and may be dispersed in the solvent S. In a case that the ultrasonic waves SN are applied to the liquid solvent S, cavitation energy is created, and accordingly a force such as vibrations or shock waves may be applied to the solvent S. The semiconductor elements SE formed on the surface of the substrate SUB may be separated from the substrate SUB by the physical force generated by the cavitation energy of the ultrasonic waves SN.

Figure 4:
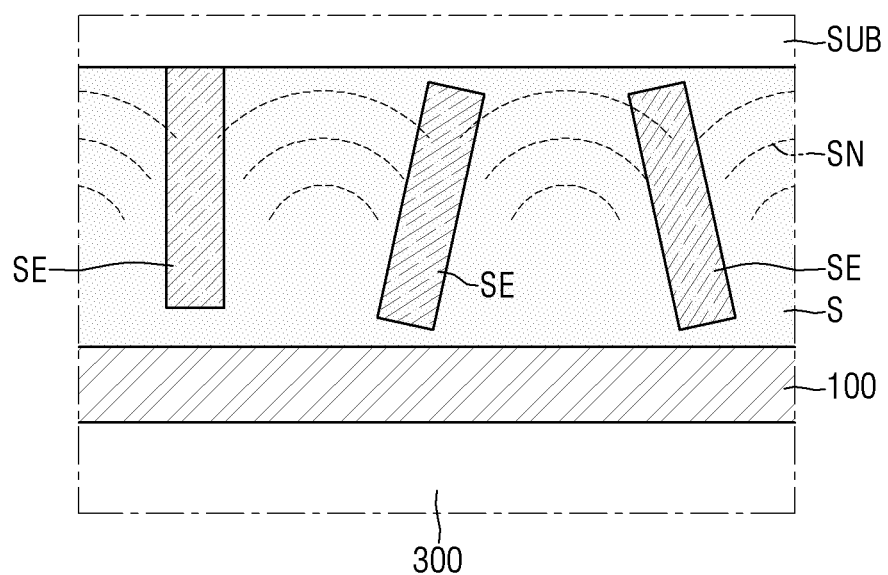
FIG. 4 is a schematic diagram showing that semiconductor elements are separated from a substrate according to an embodiment.

FIG. 4 is a schematic diagram showing that semiconductor elements are separated from a substrate according to an embodiment.

Referring to FIG. 4, the ultrasonic waves SN generated by the ultrasonic generator 300 may be transmitted to the inside of the base 100, and the vibrations or shock waves created by the ultrasonic waves SN may be evenly transmitted to the substrate SUB on which the semiconductor elements SE are formed. The ultrasonic generator 300 disposed at the bottom of the base 100 may have predetermined widths in the first direction DR1 and the second direction DR2. The ultrasonic waves SN may be evenly generated at least in the plane direction, for example, the first direction DR1 and the second direction DR2. The semiconductor elements SE may be separated from the substrate SUB by the physical force transmitted by ultrasonic waves SN. According to an embodiment, the ultrasonic generator 300 may generate the ultrasonic waves SN so that they may face a direction perpendicular or horizontal to the surface of the substrate SUB disposed in the base 100. The direction in which the ultrasonic waves SN are generated by the ultrasonic generator 300 to propagate may be defined. The propagation direction of the ultrasonic waves SN (hereinafter, the direction of the ultrasonic waves) may be perpendicular or horizontal to the surface of the substrate SUB. It is to be noted that the direction of the ultrasonic waves SN may vary depending on the position of the ultrasonic generator 300 and the orientation of the substrate SUB placed in the base 100. A more detailed description thereon will be given later.

In a case that the semiconductor elements SE formed on the substrate SUB are separated mechanically using a tool, the separation surfaces of the semiconductor elements SE may not be neat or uniform or there may be large deviations in length among the separated semiconductor elements SE. In contrast, in a case that the semiconductor elements SE are separated by using the apparatus 10 according to an embodiment, it may be possible to reduce deviations in length among the separated semiconductor elements SE and to form the neat or uniform separation surfaces. For example, the ultrasonic generator 300 may have a width sufficient to cover or overlap at least the substrate SUB placed in the base 100. The ultrasonic waves SN generated by the ultrasonic generator 300 may be uniformly transmitted to the substrate SUB in the plane direction in the solvent S, and a force of uniform intensity may be transmitted to the substrate SUB regardless of the position. The plurality of semiconductor elements SE formed on the substrate SUB may be separated by a uniform intensity, and deviations in length among the separated semiconductor elements SE may be reduced. It is, however, to be understood that the disclosure is not limited thereto. The ultrasonic generator 300 may not necessarily have a width greater than that of the substrate SUB, and its shape and structure are not particularly limited as long as it can generate the ultrasonic waves SN irrespective of the size of the substrate SUB.

As will be described later, in embodiments, each of the semiconductor elements SE may be a light-emitting diode ED (see FIG. 36) including a plurality of semiconductor layers and an emissive layer. Such light-emitting diodes ED may be fabricated using the apparatus 10 for separating semiconductor elements. The light-emitting diodes ED may also be formed on the substrate SUB, and may be separated from the substrate SUB with a neat or uniform separation surface using the apparatus 10. Since the separation surfaces of the light-emitting diodes ED are neat or uniform, the electrodes in contact with the separation surfaces of the light-emitting diodes ED may easily contact them without contact failure or breakage of electrode materials. For example, since there are less deviations in length among the light-emitting diodes ED, it may be possible to reduce the defect rate for use in a device requiring the light-emitting diodes ED to have a constant length.

Hereinafter, a process of separating the semiconductor elements SE using the apparatus 10 for separating semiconductor elements will be described in more detail with reference to other drawings.

Figure 5:
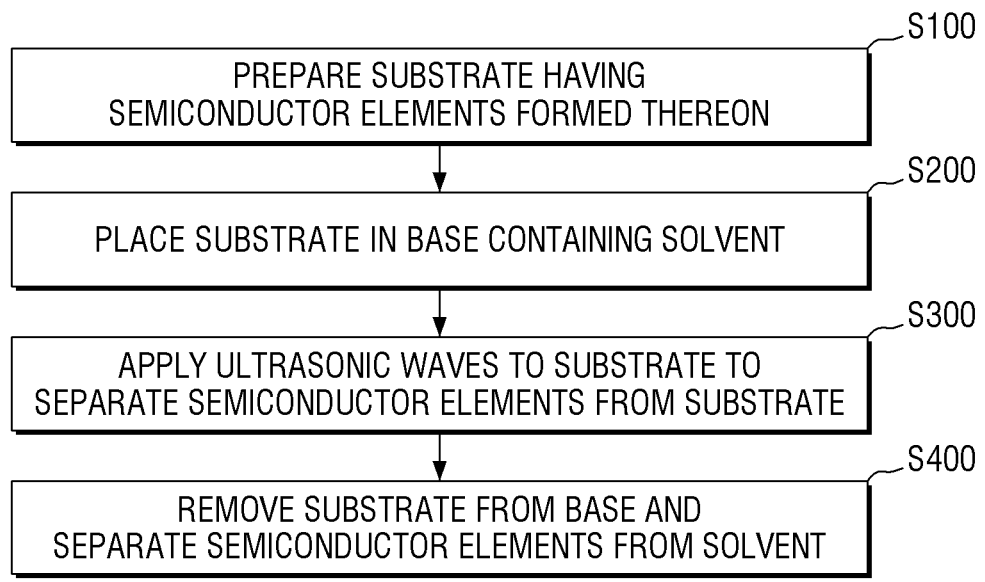
FIG. 5 is a flowchart for illustrating a method for fabricating semiconductor elements according to an embodiment.

FIG. 5 is a flowchart for illustrating a method for separating semiconductor elements according to an embodiment.

Referring to FIG. 5, the method for separating semiconductor elements SE may include preparing a substrate SUB having semiconductor elements SE formed thereon (step S100), locating or placing the substrate SUB in a base 100 containing a solvent S (step S200), separating the semiconductor elements SE from the substrate SUB by applying ultrasonic waves SN to the substrate SUB (step S300), and removing the substrate SUB from the base 100 and separating the semiconductor elements SE from the solvent S (step S400). The method for separating the semiconductor elements SE may include applying ultrasonic waves SN to the substrate SUB on which the semiconductor elements SE are formed in the solvent S to separate them. The ultrasonic waves SN may be applied in a variety of ways or directions. The semiconductor elements SE may be separated from the substrate SUB by the physical force due to the ultrasonic waves SN. By using the apparatus 10, it may be possible to separate the semiconductor elements SE grown on the substrate SUB so that the separation surface is neat or uniform and deviations in length may be reduced.

FIGS. 6 to 9 are schematic diagrams showing processing steps of fabricating semiconductor elements in sequence according to an embodiment.

Figure 7:
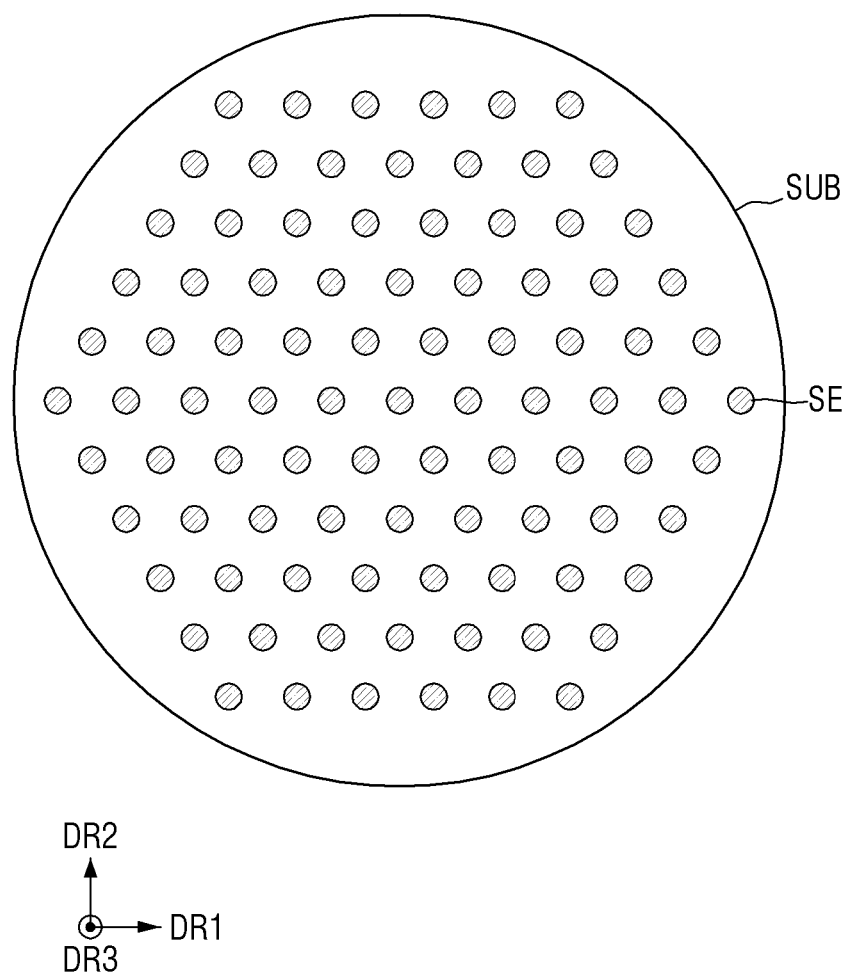

FIG. 6 is a side view of the substrate SUB on which the semiconductor elements SE are formed. FIG. 7 is a plan view of the substrate SUB when viewed from the top. Initially, referring to FIGS. 6 and 7, a substrate SUB on which semiconductor elements SE are formed is prepared. The plurality of semiconductor elements SE may be formed on a surface of the substrate SUB such that they may be extended in a direction and spaced apart from other adjacent semiconductor elements SE. The semiconductor elements SE may have a shape substantially of a rod, a wire, a tube, for example, within the spirit and the scope of the disclosure. In an embodiment, the semiconductor elements SE may have a substantially cylindrical or rod-like shape. It is to be understood that the shape of the semiconductor elements SE is not limited thereto. The semiconductor elements SE may have a variety of shapes including a substantially polygonal column shape such as a cube, a cuboid and a hexagonal column, or a shape that may be extended in a direction with partially inclined outer surfaces.

As an example, the semiconductor elements SE may be formed or disposed on the substrate SUB by epitaxial growth. The substrate SUB may include a support substrate and a buffer layer disposed thereon. The semiconductor elements SE may be formed by crystal growth of seed crystals on the buffer layer. In embodiments, the support substrate of the substrate SUB may include a transparent substrate such as a sapphire substrate ($Al_2O_3$) and glass. It is, however, to be understood that the disclosure is not limited thereto. The support substrate may be formed as a conductive substrate such as GaN, SiC, ZnO, Si, GaP and GaAs. The buffer layer of the substrate SUB may be disposed to reduce a difference in a lattice constant between the semiconductor elements SE and the support substrate, and may include an undoped semiconductor. Although the semiconductor elements SE may be formed as a single layer in the drawings, the disclosure is not limited thereto. The semiconductor elements SE may have a structure in which multiple semiconductor layers may be sequentially stacked on one another.

The semiconductor elements SE formed by the epitaxial growth may be connected to the substrate SUB at their contact portions. In a process of separating the semiconductor elements SE formed by growing the semiconductor crystal from the substrate SUB, the apparatus 10 may be used so that the separation surfaces of the semiconductor elements SE are formed neatly or uniformly.

Figure 8:
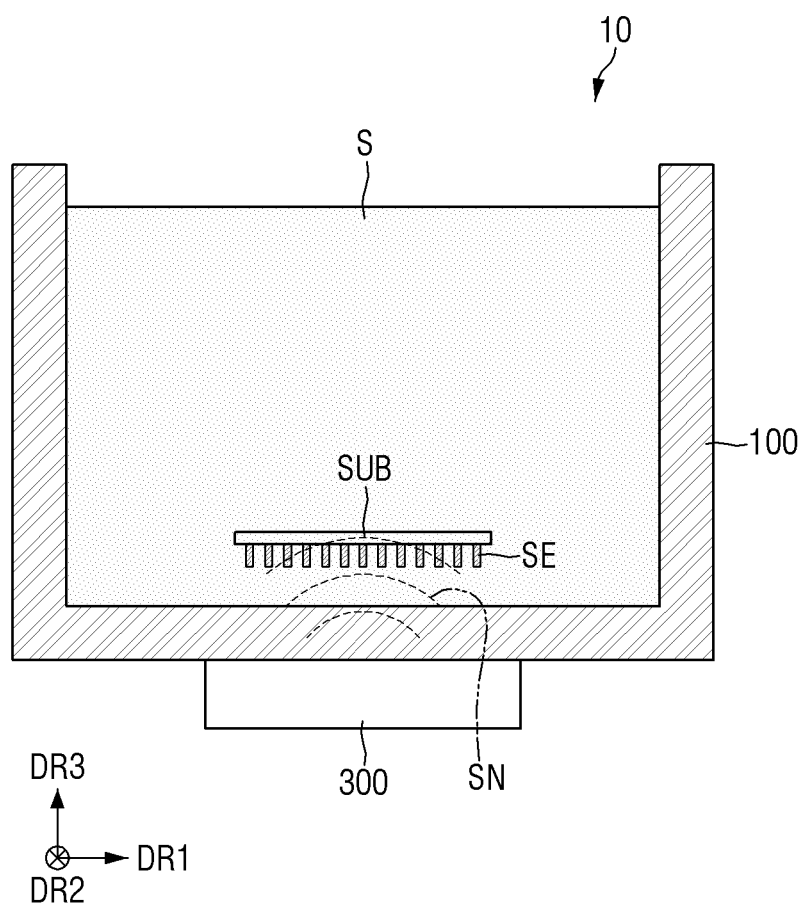
Figure 9:
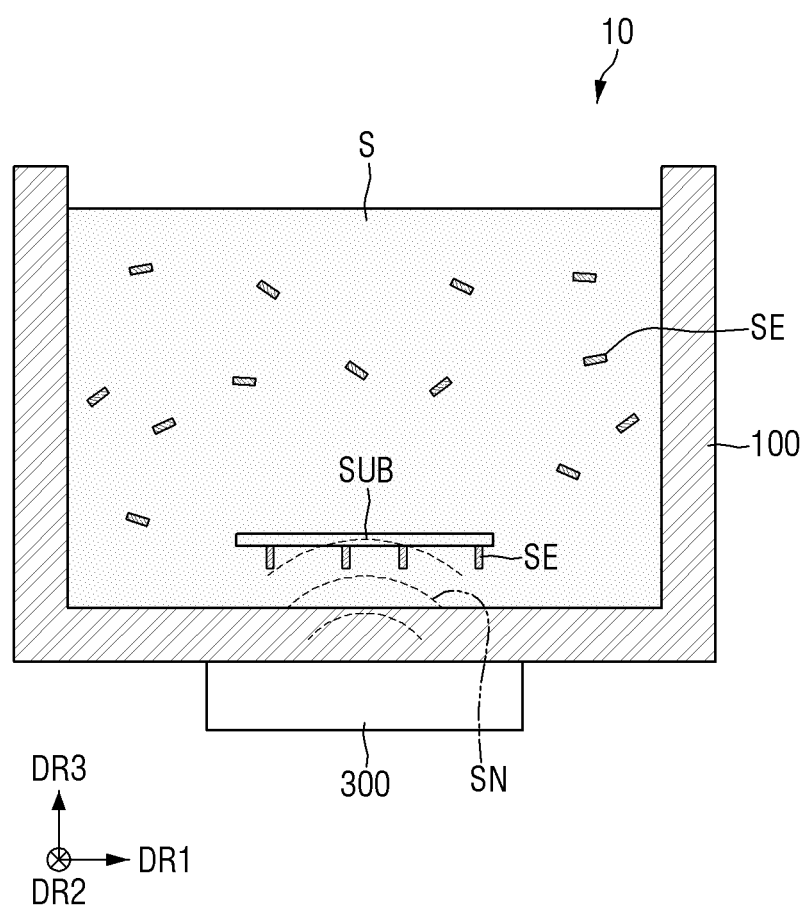

Referring to FIGS. 8 and 9, the substrate SUB on which the semiconductor elements SE are formed is placed in the base 100 in which the solvent S is prepared, and ultrasonic waves SN are applied to the substrate SUB using the ultrasonic generator 300.

According to an embodiment, the position of the ultrasonic generator 300 and the substrate SUB may be changed so that the ultrasonic waves SN may be transmitted in a vertical or horizontal direction to the surface of the substrate SUB on which the semiconductor elements SE may be formed. For example, as shown in FIG. 8, in a case that the ultrasonic generator 300 is disposed at the bottom of the base 100, the substrate SUB may be placed in parallel to the lower surface of the base 100 so that the lower surface faces the substrate. The ultrasonic waves SN may be generated so that they may face a direction perpendicular to the surface of the substrate SUB, and the direction of the ultrasonic waves SN may be directed along the direction in which the semiconductor elements SE are extended. For example, the substrate SUB may be disposed so that the surface on which the semiconductor elements SE are formed faces the lower side in the drawings, for example, the ultrasonic generator 300, and the semiconductor elements SE may be located or disposed between are the substrate SUB and the ultrasonic generator 300. The semiconductor elements SE may receive the ultrasonic waves SN generated by the ultrasonic generator 300 from the front side, and may be separated from the substrate SUB by the ultrasonic waves SN having a stronger intensity.

Subsequently, although not shown in the drawings, once the semiconductor elements SE are completely separated from the substrate SUB, the substrate SUB may be removed from the base 100, and the semiconductor elements SE dispersed in the solvent S may be separated from one another. The process of separating the semiconductor elements SE from the solvent S may include a process of removing the substrate SUB from the base 100 and a process of filtering the solvent S and the semiconductor elements SE. For example, the solvent S and the semiconductor elements SE may be moved to another container, and then the semiconductor elements SE may be cleaned and filtered so that only the semiconductor elements SE may be separated. Alternatively, in some cases, after removing the substrate SUB, the semiconductor elements SE may be stored as they are dispersed the solvent S. In such case, the solvent S may be made of a material that has physical properties so that it can store the semiconductor elements SE for a long time. Accordingly, a separate process of separating the semiconductor elements SE from the apparatus 10 may be omitted.

In this manner, the semiconductor elements SE may be produced using the apparatus 10 for separating semiconductor elements. As the semiconductor elements SE formed on the substrate SUB by the epitaxial growth are separated using ultrasonic waves SN, there are advantages in that deviations in length may be reduced and the separation surface may be neat or uniform.

It is to be noted that in the separation process using the apparatus 10, the orientation of the substrate SUB may be variously changed depending on the direction of the ultrasonic waves SN. According to an embodiment, the surface of the substrate SUB may face the ultrasonic generator 300, but the disclosure is not limited thereto. The surface of the substrate SUB may be located or disposed in the direction perpendicular to the lower surface of the base 100.

Figure 10:
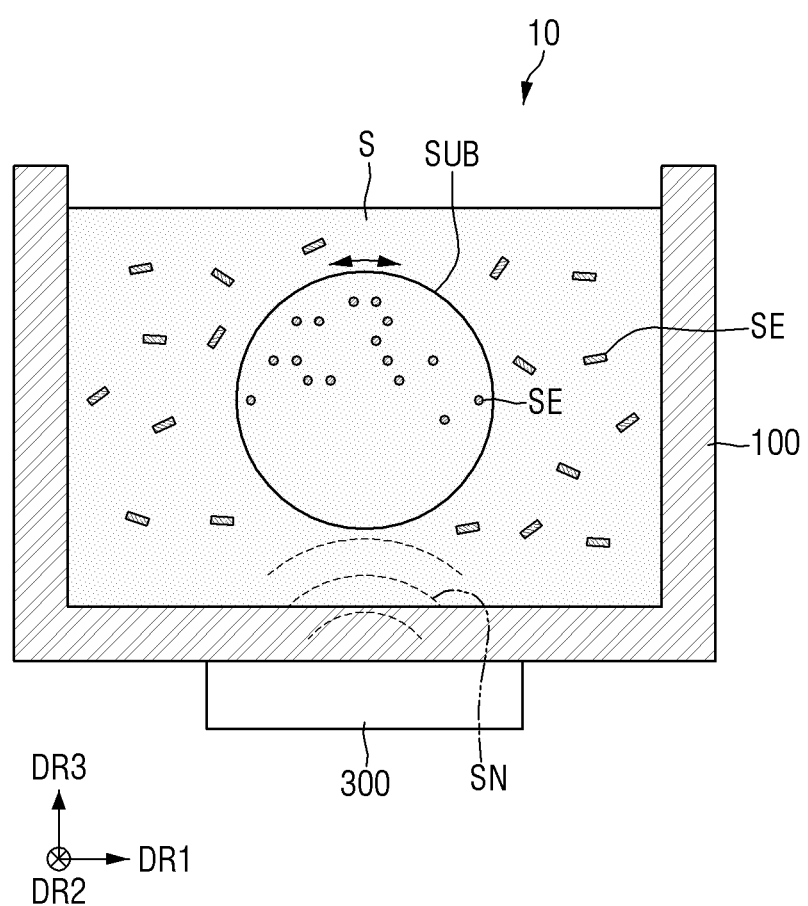
FIG. 10 is a schematic diagram showing a step in a process of separating semiconductor elements according an embodiment.

FIG. 10 is a schematic diagram showing a step in a process of separating semiconductor elements according to an embodiment.

Referring to FIG. 10, in the process of separating the semiconductor elements SE using the apparatus 10, the substrate SUB may be placed in the direction perpendicular to the lower surface of the base 100. The ultrasonic waves SN generated by the ultrasonic generator 300 may be directed in the direction parallel to the surface of the substrate SUB, and ultrasonic waves SN may be transmitted to the contact portions between the semiconductor elements SE and the substrate SUB in the direction perpendicular to the direction in which they may be extended. Accordingly, the ultrasonic waves SN may be directed to the portions of the semiconductor elements SE to be separated and thus they may be separated more effectively.

As described above, the ultrasonic generator 300 disposed at the bottom of the base 100 may generate ultrasonic waves SN of uniform intensity in the first direction DR1 and the second direction DR2, for example, the plane direction. As the substrate SUB is placed in the direction perpendicular to the lower surface of the base 100, however, the intensity of the ultrasonic waves SN may become different in the third direction DR3 which is the thickness direction. For example, the intensity of ultrasonic waves SN at a portion of the substrate SUB that may be adjacent to the lower surface of the base 100 or the ultrasonic generator 300 may be different from that at the opposite portion of the substrate SUB. At some or a number of portions of the substrate SUB, the semiconductor elements SE may not be completely separated from the substrate SUB. In order to compensate for this, according to an embodiment, a process of rotating the substrate SUB that may be placed or disposed perpendicularly to the lower surface of the base 100 with respect to the center may be further performed during the process of separating the semiconductor elements SE. As the substrate SUB is rotated, the portions of the substrate SUB that may be distant from the ultrasonic generator 300 may be located or disposed closer to the ultrasonic generator 300, and thus the semiconductor elements SE formed or disposed on the substrate SUB may be uniformly separated.

The ultrasonic generator 300 of the apparatus 10 may transmit ultrasonic waves SN to the inside of the base 100, and the ultrasonic waves SN may transmit vibrations or shock waves uniformly in the solvent S. Even if the size of the base 100 increases according to the output of the ultrasonic generator 300, it may be possible to transmit the ultrasonic waves SN of substantially uniform intensity, and more substrates SUB may be placed in a single process of separating the semiconductor elements SE. As a result, there is an advantage that the time required for the process of separating the semiconductor elements SE may be further reduced.

Figure 11:
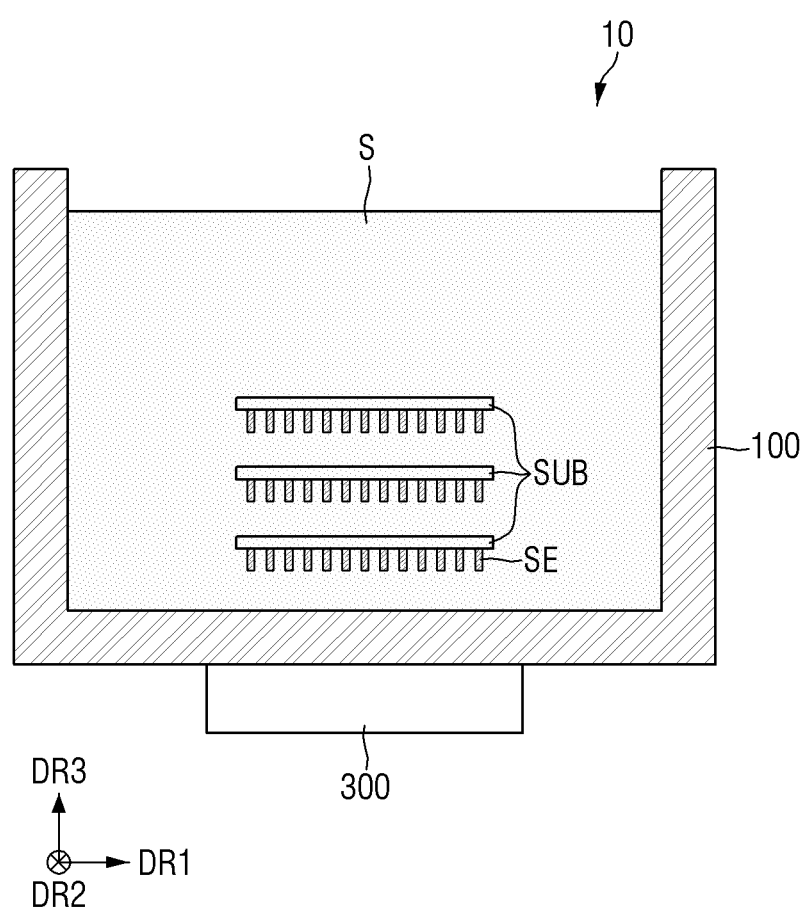
FIGS. 11 to 13 are schematic diagrams showing steps in a process of separating semiconductor elements according to embodiments.
Figure 12:
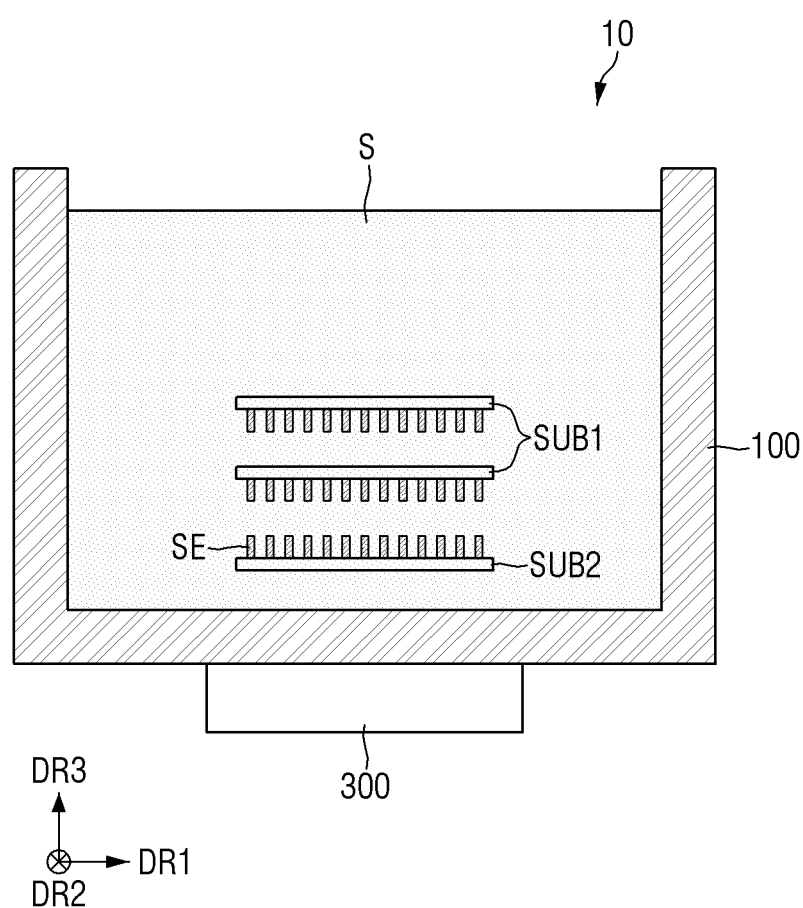
Figure 13:
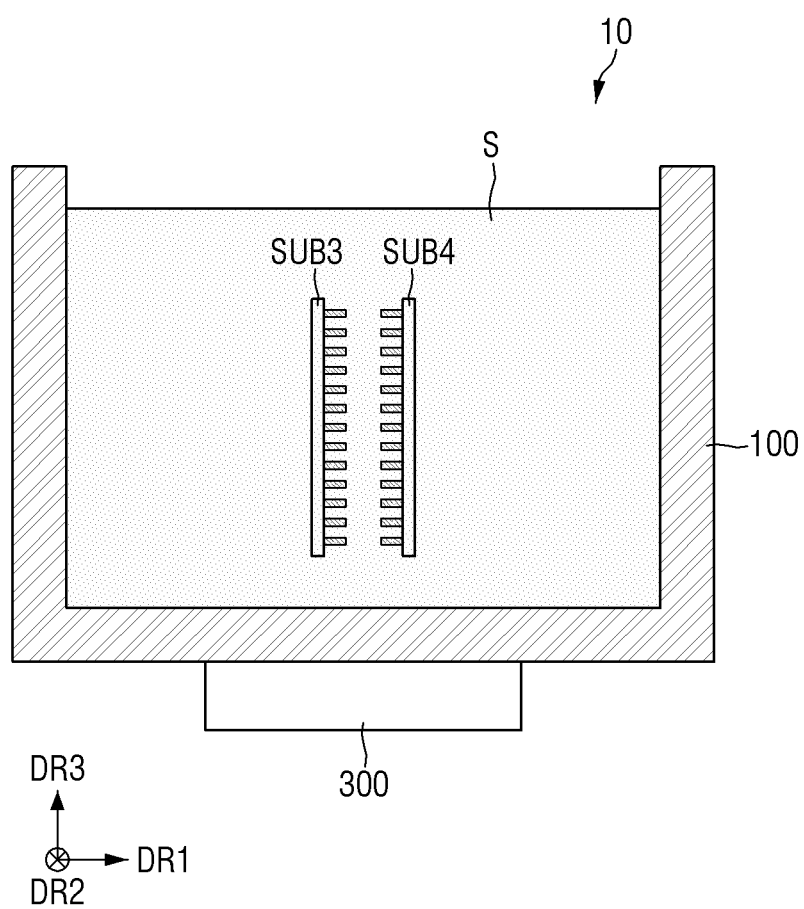

FIGS. 11 to 13 are schematic diagrams showing steps in a process of separating semiconductor elements according to embodiments.

Referring to FIGS. 11 to 13, a plurality of substrates SUBs may be placed in the base 100 during the process of separating the semiconductor elements SE.

According to an embodiment of FIG. 11, three substrates SUB are placed in the base 100 as an example, however, the disclosure is not limited thereto. The plurality of substrates SUBs may be placed such that the surfaces thereof on which the semiconductor elements SE are formed may face the lower surface of the base 100. Ultrasonic waves SN generated by the ultrasonic generator 300 may travel in the direction perpendicular to the surfaces of the substrates SUB. The surfaces of the substrates SUB may all face the same direction, but the disclosure is not limited thereto. According to an embodiment of FIG. 12, the plurality of substrates SUB may include first substrates SUB1 having the surfaces facing the lower surface of the base 100, and a second substrate SUB2 having the surface facing in the same direction as the lower surface of the base 100. The second substrate SUB2 may face one of the first substrates SUB1, and the surface of the other one of the first substrates SUB1 may face the opposite surface of the first substrate SUB1 facing the second substrate SUB2.

According to an embodiment of FIG. 13, a plurality of substrates SUBs may be placed such that surfaces thereof face sidewalls of the base 100, respectively. The substrates SUB may include a third substrate SUB3 having the surface facing in the direction opposite to the first direction DR1, and a fourth substrate SUB4 having the surface facing in the first direction DR1. The third and fourth substrates SUB3 and SUB4 may be placed in the direction perpendicular to the lower surface of the base 100, and the distance between the ultrasonic generator 300 and the semiconductor elements SE formed thereon may be different depending on their positions. As described above, a process of rotating the third substrate SUB3 and the fourth substrate SUB4 with respect to the center of the substrates may be performed during the process of separating the semiconductor elements SE, so that the semiconductor elements SE may be uniformly separated from the substrate SUB regardless of their positions.

In a case that a plurality of substrates SUBs is placed in the base 100, the distance between the ultrasonic generator 300 and the substrates SUBs may be different, and as another substrate may be disposed between one substrate and the ultrasonic generator 300, the intensity of ultrasonic waves SN may be changed. In this regard, the ultrasonic waves SN may transmit a physical force such as vibrations or shock waves to the substrates SUBs through the solvent S, and thus the semiconductor elements SE may be separated effectively even in a case that the plurality of substrates SUBs is disposed. If the degree of separation, for example, the amount of semiconductor elements separated from the substrates SUBs varies depending on their positions, a process of changing the positions of the substrates SUBs based on the measurement of the degree may be further carried out. More detailed description thereon will be given with reference to an embodiment.

Hereinafter, apparatuses for separating semiconductor elements according to a variety of embodiments will be described in reference to other drawings.

FIGS. 14 to 17 are schematic diagrams showing apparatuses for separating semiconductor elements according to an embodiment.

Referring to FIGS. 14 to 17, apparatuses for separating semiconductor elements 10_1, 10_2, 10_3 and 10_4 may include a larger number of ultrasonic generators 300 (310, 320, 330, 340 and 350). The ultrasonic generator 300 disposed at the bottom of the base 100 may generate uniform ultrasonic waves SN inside the base 100 in the plane direction or in the first direction DR1 and the second direction DR2. However, the intensity of the ultrasonic waves SN may be changed along the thickness direction or the third direction DR3 from the ultrasonic generator 300. Each of the apparatuses 10_1, 10_2, 10_3 and 10_4 according to embodiments may include a larger number of ultrasonic generators 300 and may generate ultrasonic waves SN of uniform intensity regardless of the positions of the substrates SUBs placed in the receiving portion of the base 100, so that it may be possible to improve the efficiency of separating semiconductor elements SE.

Figure 14:
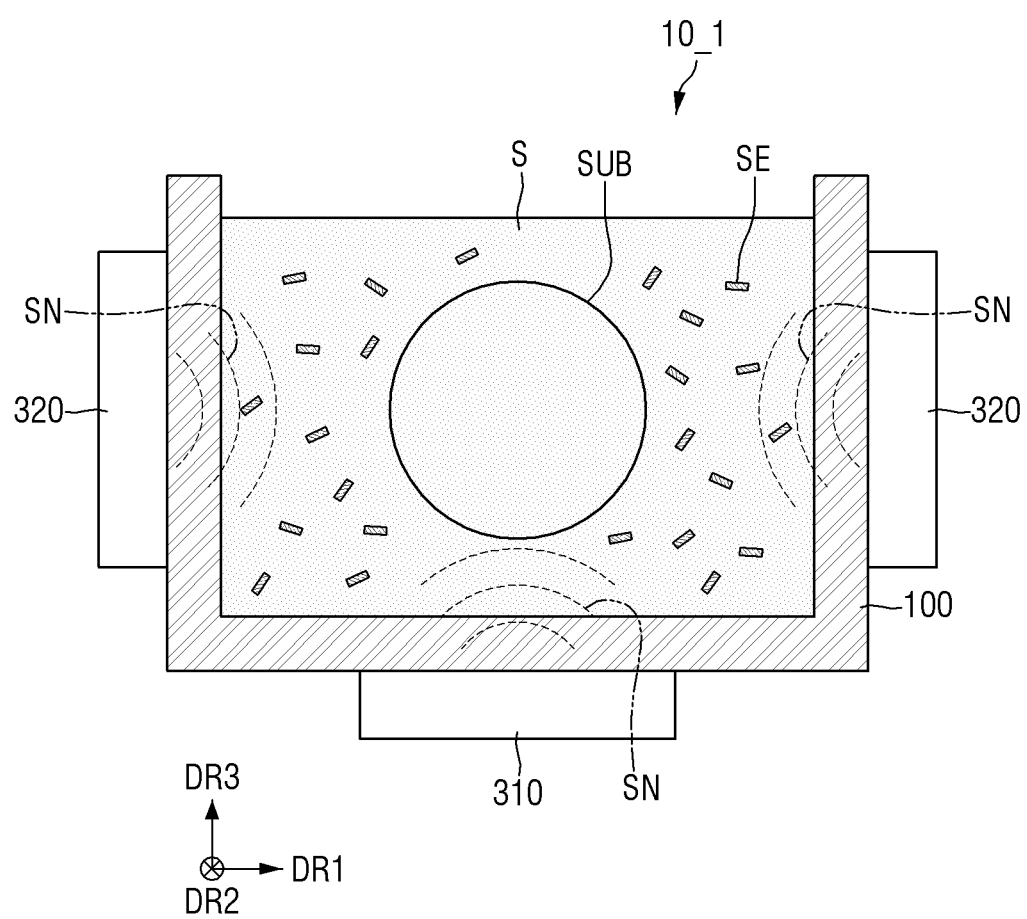
FIGS. 14 to 17 are schematic diagrams showing apparatuses for separating semiconductor elements according to an embodiment.

First, the apparatus 10_1 for separating semiconductor elements of FIG. 14 may include a first ultrasonic generator 310 disposed at the bottom of the base 100, and a plurality of second ultrasonic generators 320 disposed on the both sidewalls of the base 100. The second ultrasonic generators 320 may be disposed on one or a side of the base 100 in the first direction DR1 and the opposite side or another side of the base 100 in cross section. The ultrasonic waves SN generated by the first ultrasonic generator 310 may travel in a direction from the lower surface of the base 100 toward the third direction DR3. The ultrasonic waves SN may be generated by the second ultrasonic generators 320 may travel in the first direction DR1 or the opposite direction from the side surfaces of the base 100, respectively. In a case that the substrate SUB is placed in the receiving portion of the base 100, uniform ultrasonic waves SN may be generated in the plane direction by the first ultrasonic generator 310, and ultrasonic waves SN of a similar intensity may be generated in the height direction by the second ultrasonic generators 320. As shown in FIG. 14, in a case that the substrate SUB is placed in the direction perpendicular to the lower surface of the base 100, the second ultrasonic generators 320 may generate ultrasonic waves SN of a similar intensity toward the third direction DR3. Accordingly, it may be possible to separate the semiconductor elements SE effectively without rotating the substrate SUB regardless of the position.

Figure 15:
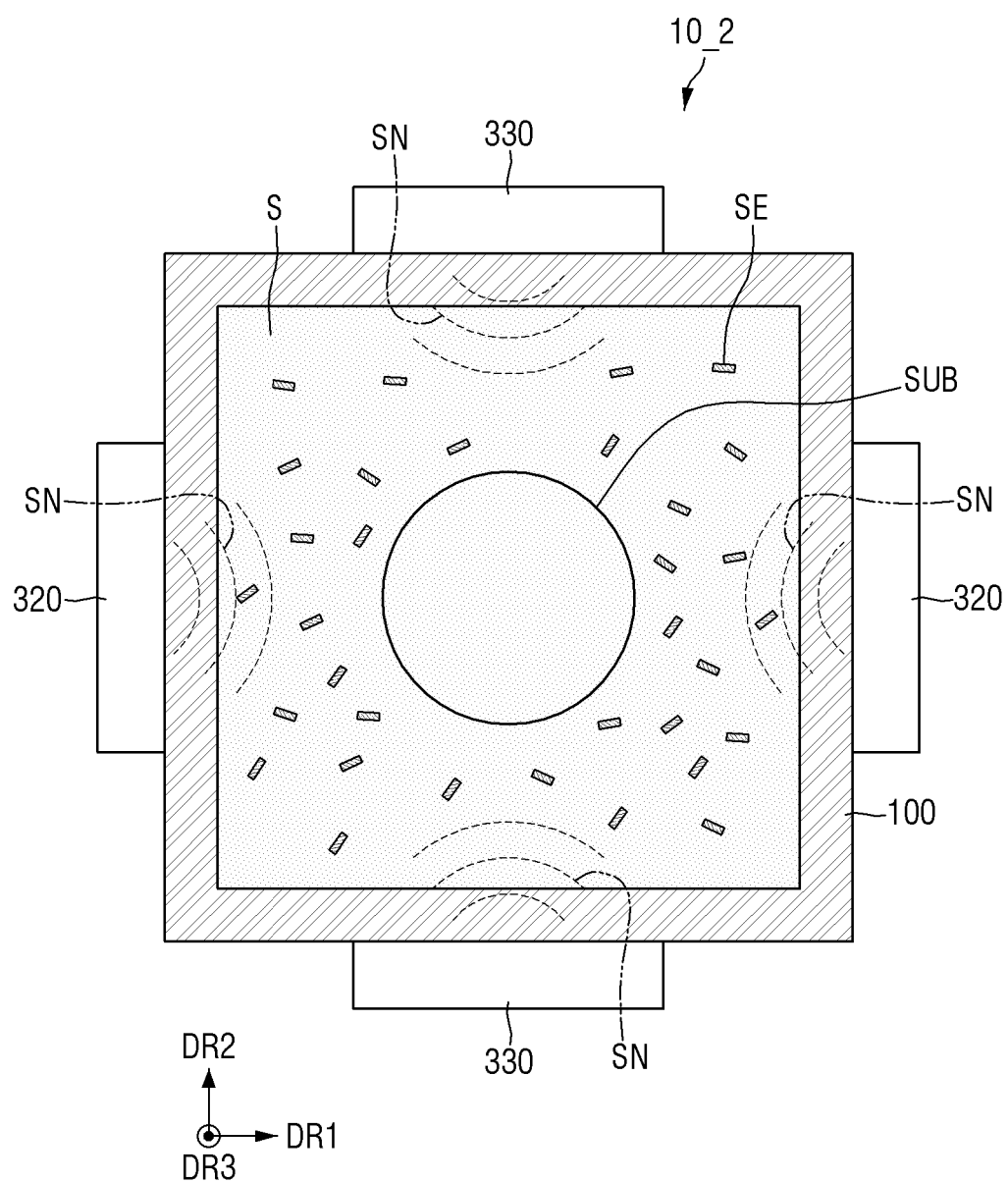

FIG. 15 is a plan view of the apparatus 10_2 for separating semiconductor elements viewed from above. The apparatus 10_2 of FIG. 15 may further include third ultrasonic generators 330 in addition to the plurality of second ultrasonic generators 320 disposed on the both sidewalls of the base 100. The second ultrasonic generators 320 may be disposed on the both sidewalls of the base 100 in the first direction DR1 and the opposite direction in a plan view. The third ultrasonic generators 330 may be disposed on the both sidewalls of the base 100 in the second direction DR2 and the opposite direction in a plan view. The apparatus 10_2 according to an embodiment may include the ultrasonic generators on the four sidewalls of the base 100, and thus ultrasonic waves SN of a uniform level may be generated throughout the entire area within the receiving portion of the base 100.

Figure 16:
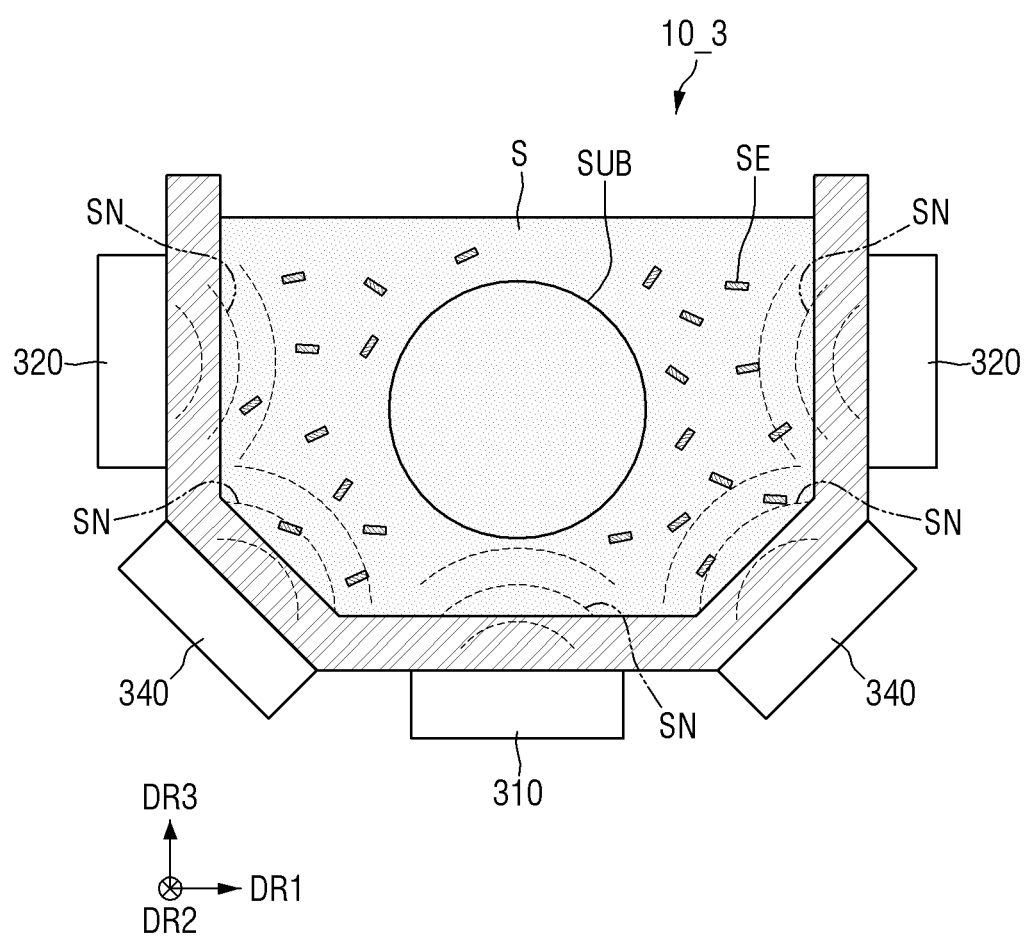

The apparatus 10_3 of FIG. 16 may include a flat lower side, sidewalls having a height in the third direction DR3, and inclined sides connecting between them in cross section. The base 100 may have a cross-sectional shape having a substantially larger width between sidewalls extended in the third direction DR3 than the width of the lower side. The ultrasonic generator 300 may include a first ultrasonic generator 310 disposed at the bottom of the base 100, second ultrasonic generators 320 disposed on the sidewalls having a height in the third direction DR3, and fourth ultrasonic generators 340 disposed on the inclined sides.

The ultrasonic waves SN generated by the first ultrasonic generator 310 may travel in the third direction DR3, and the ultrasonic waves SN generated by the second ultrasonic generators 320 may travel in the first direction DR1. The ultrasonic waves SN generated by the fourth ultrasonic generators 340 may travel in inclined directions between the first direction DR1 and the third direction DR3, respectively, and thus it may be possible to generate a higher density of ultrasonic waves SN in the receiving portion of the base 100. According to an embodiment, as the shape of the base 100 is changed, the ultrasonic generators disposed accordingly may be included, and uniform ultrasonic waves SN may be generated in the receiving portion of the base 100.

In a case that a base 100 including a receiving portion having a larger volume is employed in order to perform the separation process on more substrates SUBs at the same time, ultrasonic waves SN of relatively weak intensity may be created on the substrate SUB placed at the center of the receiving portion. To compensate for this, some or a number of the ultrasonic generators may be disposed inside of the receiving portion of the base 100.

Figure 17:
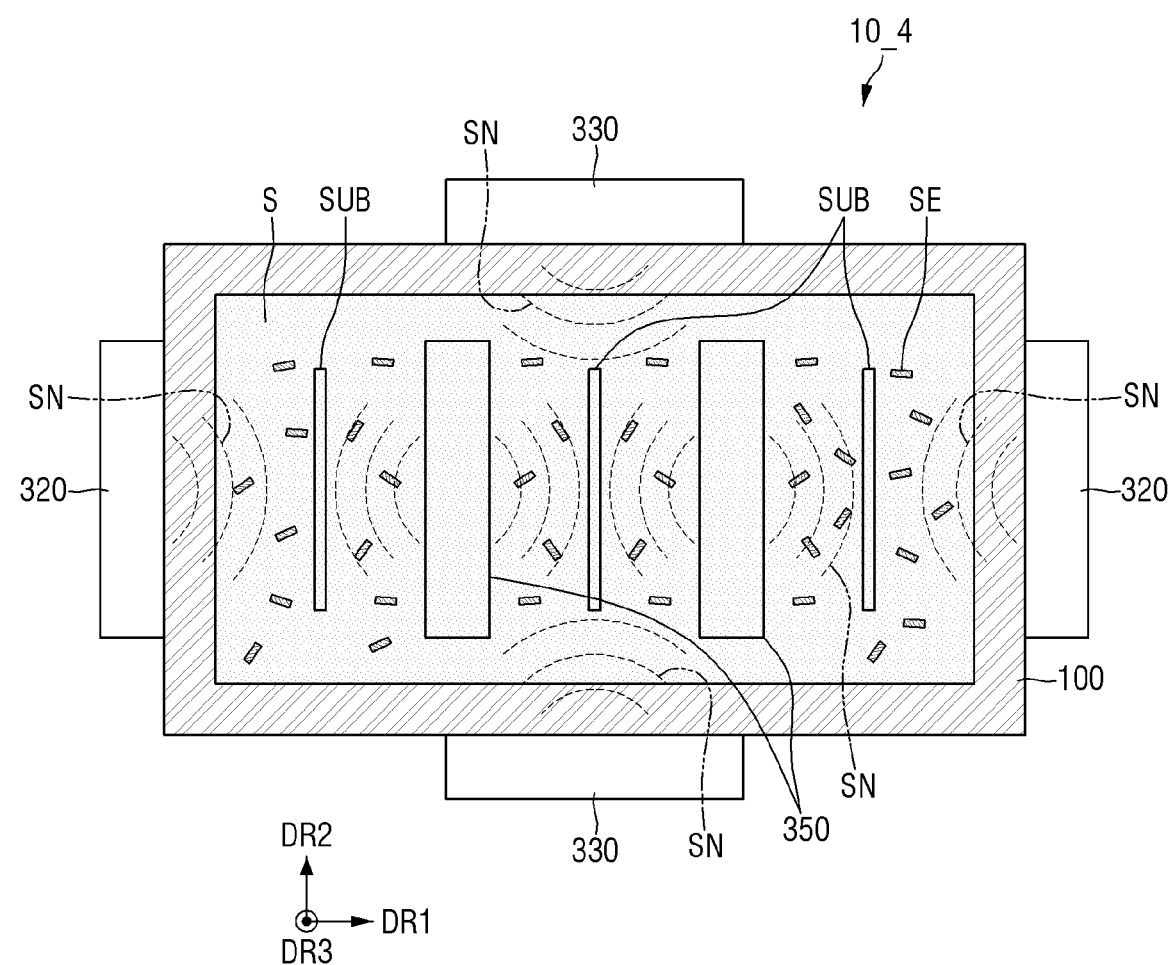

FIG. 17 is a plan view of the apparatus 10_4 for separating semiconductor elements viewed from above. The apparatus 10_4 for separating semiconductor elements of FIG. 17 may further include fifth ultrasonic generators 350 disposed in a receiving portion of the base 100 in addition to second ultrasonic generators 320 and third ultrasonic generators 330. The fifth ultrasonic generators 350 may be disposed in the receiving portion to directly generate ultrasonic waves SN to the solvent S. The substrates SUBs disposed in the receiving portion of the base 100 may be spaced apart from each other, and the fifth ultrasonic generators 350 may be disposed between some or a number of the substrates. In a case that the substrates SUB are placed in the direction perpendicular to the lower surface of the base 100, the surface of each of the substrates SUB on which the semiconductor elements SE are generated may face in the first direction DR1, and may face the second ultrasonic generators 320 that generate ultrasonic waves SN in the first direction DR1. As the inner space of the base 100 has a large volume, in a case that the width in the first direction DR1 may be large, the intensity of the ultrasonic waves SN generated by the second ultrasonic generators 320 may vary along the first direction DR1. If the distances between the plurality of substrates SUBs arranged or disposed along the first direction DR1 and the second ultrasonic generators 320 may be different, the semiconductor elements SE may not be separated effectively from the substrates SUBs at the center. In this regard, according to an embodiment, as the apparatus 10_4 may further include the fifth ultrasonic generators 350 disposed in the receiving portion of the base 100, deviations in the distance between the plurality of substrates SUBs and the second ultrasonic generators 320 or the fifth ultrasonic generator 350 in the first direction DR1 may be reduced. Even though the substrates SUBs may be sequentially arranged or disposed in one direction, the ultrasonic generators 300 may be disposed between them, and thus the semiconductor elements SE may be separated from the substrates SUB with a uniform efficiency.

It is to be noted that in an embodiment, the ultrasonic generators 300 may be disposed directly on the base 100. It is, however, to be understood that the disclosure is not limited thereto. The ultrasonic generators may be separated from the base 100 as separate elements. In such case, the ultrasonic generator or generators 300 may apply ultrasonic waves SN to a particular or predetermined location on the substrate SUB, and may selectively separate the semiconductor elements SE from a desired region.

Figure 18:
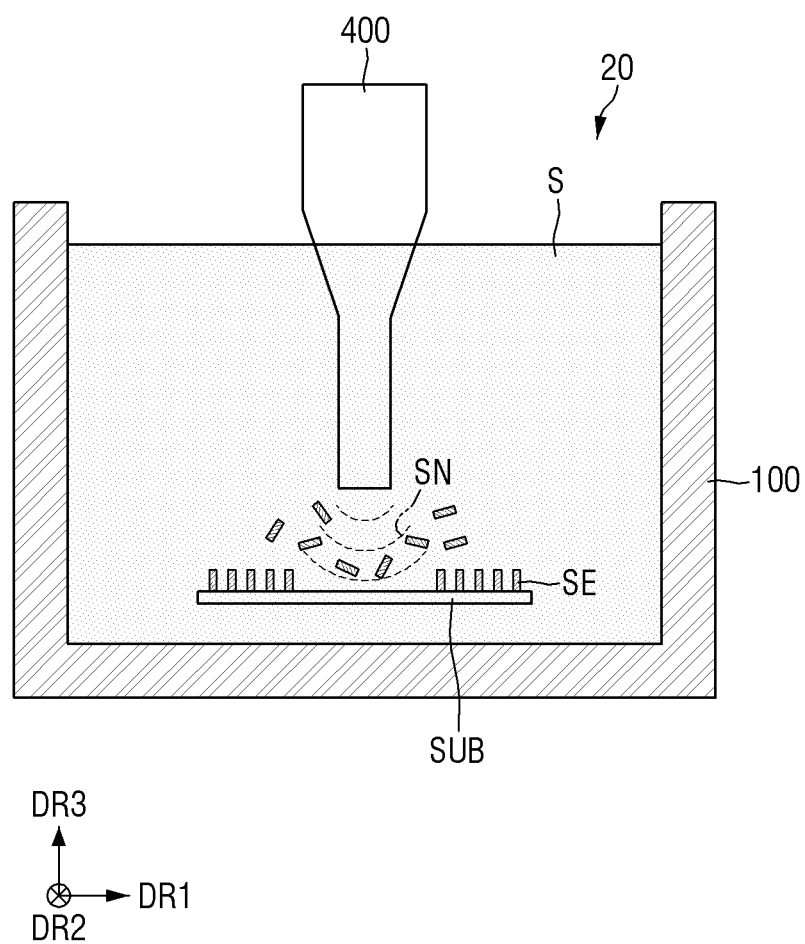
FIGS. 18 to 20 are schematic diagrams showing apparatuses for separating semiconductor elements according to embodiments.
Figure 19:
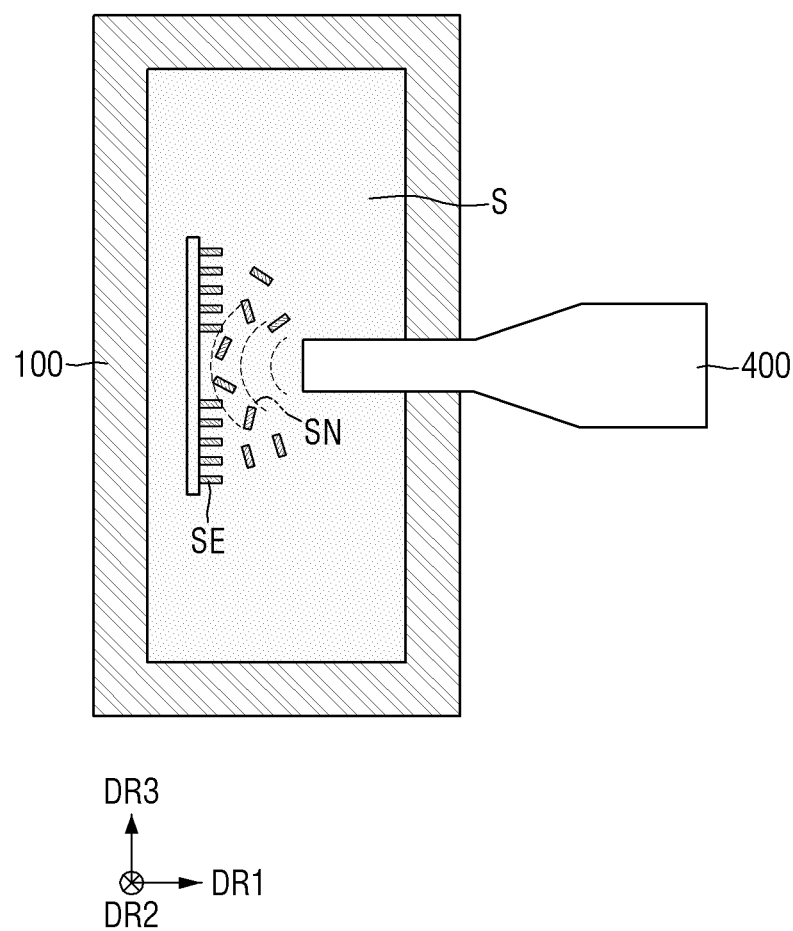
Figure 20:
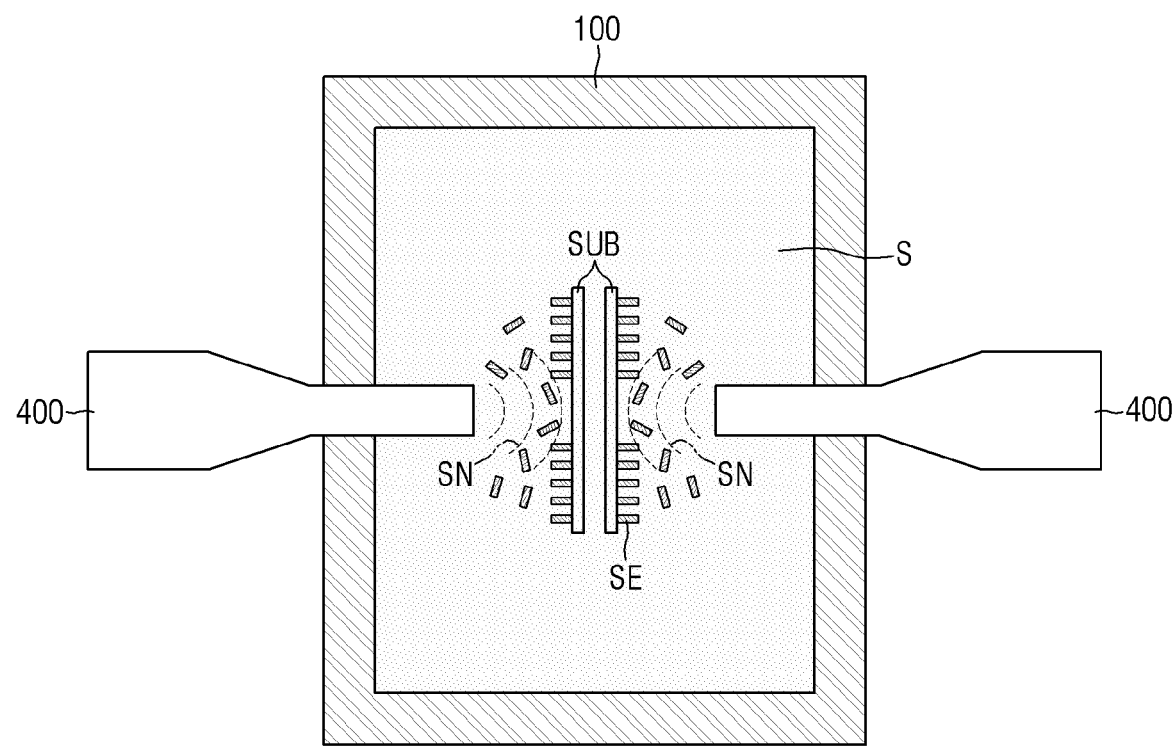

FIGS. 18 to 20 are schematic diagrams showing apparatuses for separating semiconductor elements according to embodiments.

First, referring to FIGS. 18 and 19, in an apparatus 20 for separating semiconductor elements according to embodiments, an ultrasonic generator 400 may not be disposed directly on the base 100 but may be separately provided. The ultrasonic generator 400 may have a substantially probe-type or probe shape and may be electrically connected to an external device to receive voltage for generating ultrasonic waves SN. The ultrasonic generator of the probe-type (hereinafter referred to as the probe-type or probe ultrasonic generator 400) may apply ultrasonic waves SN in the direction perpendicular to the surface of the substrate SUB from the outside of the base 100. According to an embodiment of FIG. 18, the bottom of the base 100 may be disposed horizontally to the ground, and the substrate SUB may also be disposed horizontally to the lower surface of the base 100. According to an embodiment of FIG. 19, the bottom of the base 100 may be disposed vertically to the ground, and the substrate SUB may be disposed horizontally to the lower surface of the base 100. The probe-type ultrasonic generator 400 may be disposed in the direction perpendicular to the substrate SUB to generate ultrasonic waves SN in the direction perpendicular to the surface of the substrate SUB.

According to an embodiment, the probe-type ultrasonic generator 400 may be formed such that a portion where the ultrasonic waves SN are generated may have a width substantially smaller than that of the substrate SUB, and may generate ultrasonic waves SN selectively only on a region of the surface of the substrate SUB. Different from an embodiment of FIGS. 1 to 3, the probe-type ultrasonic generator 400 may not generate uniform ultrasonic waves SN on the entire surface of the substrate SUB. Therefore, only some or a number of the semiconductor elements SE at a position in line with the probe-type ultrasonic generator 400 may be separated. According to an embodiment, it may be possible to more directly transfer cavitation energy by the ultrasonic waves SN to the surface of the substrate SUB, compared to an embodiment in which the ultrasonic generator 300 may be disposed directly on the base 100. For example, the process time required to separate the semiconductor elements SE at the position may be reduced. If the ultrasonic waves SN are applied to the semiconductor elements SE for a long time, the semiconductor elements SE themselves may be damaged. By using the probe-type ultrasonic generator 400, it may be possible to effectively separate the semiconductor elements SE from the substrate SUB without damage to the semiconductor elements SE.

Since the semiconductor elements SE may be separated by using the probe-type ultrasonic generator 400, a plurality of probe-type ultrasonic generators 400 may be used, whose number may be equal to the number of substrates SUBs placed in the base 100. Referring to FIG. 20, a plurality of substrates SUB may be placed in the base 100, and a plurality of probe-type ultrasonic generators 400 may separate the semiconductor elements SE formed on the substrates SUBs, respectively. The substrates SUBs may be disposed such that the surfaces may face in different directions so that the ultrasonic waves SN generated by the different probe-type ultrasonic generators 400 may be generated on the substrates SUBs, respectively. For example, the plurality of substrates SUBs may be placed so that the lower surface of the base 100 may be perpendicular to the bottom of base 100, and the lower surfaces of the substrates SUB may face each other. Accordingly, the surfaces of the substrates SUBs on which the semiconductor elements SE are formed may face in the opposite directions, and the plurality of probe-type ultrasonic generators 400 may generate ultrasonic waves SN on the substrates substantially without interfering with each other. According to an embodiment, as the plurality of probe-type ultrasonic generators 400 is employed, the process of separating the semiconductor elements SE may be carried out simultaneously on the plurality of substrates SUBs, thereby providing an advantage in the process.

On the other hand, it may not be easy to simultaneously separate the semiconductor elements SE formed on the entire surface of the substrate SUB by using the probe-type ultrasonic generator 400. In this regard, as the base 100 is separated from the probe-type ultrasonic generator 400, the probe-type ultrasonic generator 400 or the base 100 may move. According to an embodiment, in the apparatus 20 for separating semiconductor elements, the probe-type ultrasonic generator 400 may move in one direction above the substrate SUB to separate the semiconductor elements SE, or the base 100 may move together to separate the semiconductor elements SE.

Figure 21:
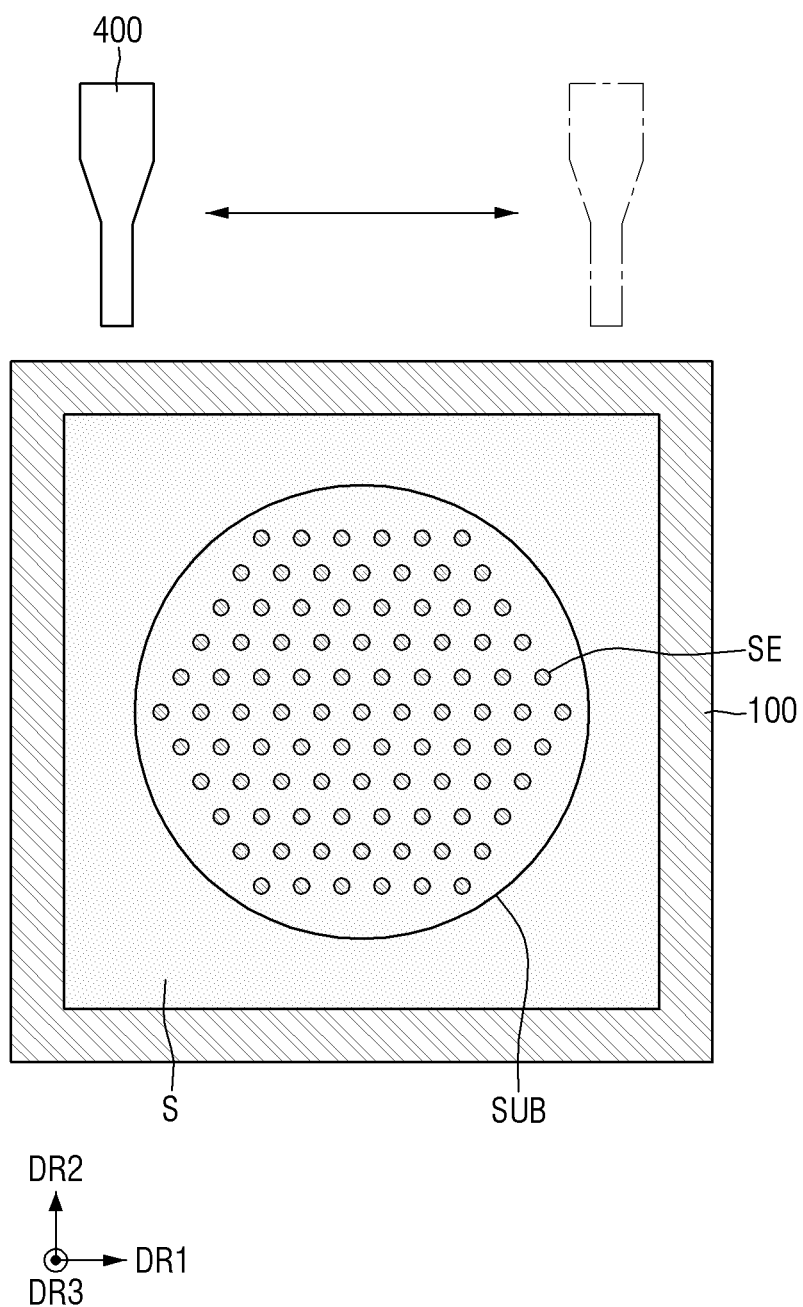
FIG. 21 is a schematic diagram showing an operation of the apparatus for separating semiconductor elements of FIG. 18.

FIG. 21 is a schematic diagram showing an operation of the apparatus for separating semiconductor elements of FIG. 18. FIG. 21 shows the movement of the probe-type ultrasonic generator 400 when the base 100 is viewed from above in order to describe the operation of the probe-type ultrasonic generator 400.

Referring to FIG. 21, the probe-type ultrasonic generator 400 may be separated from the base 100, and its part that generates the ultrasonic waves SN may be substantially smaller than the area of the substrate SUB. The probe-type ultrasonic generator 400 may separate the semiconductor elements SE from a portion of the substrate SUB and then may move in the first direction DR1 or the second direction DR2 to separate the semiconductor elements SE from another portion of the substrate SUB. The probe-type ultrasonic generator 400 may move to cover or overlap the entire surface of the substrate SUB, and may apply the ultrasonic waves SN to the surface of the substrate SUB while moving or after moving.

For example, in embodiments, the probe-type ultrasonic generator 400 may separate the semiconductor elements SE as it moves in the first direction DR1 while the base 100 moves in the second direction DR2. While the probe-type ultrasonic generator 400 moves in only one direction and generates ultrasonic waves SN, the base 100 may move under or below the probe-type ultrasonic generator 400 to separate the semiconductor elements SE. The apparatus 10 may further include other devices for moving the base 100 and the probe-type ultrasonic generator 400.

Figure 22:
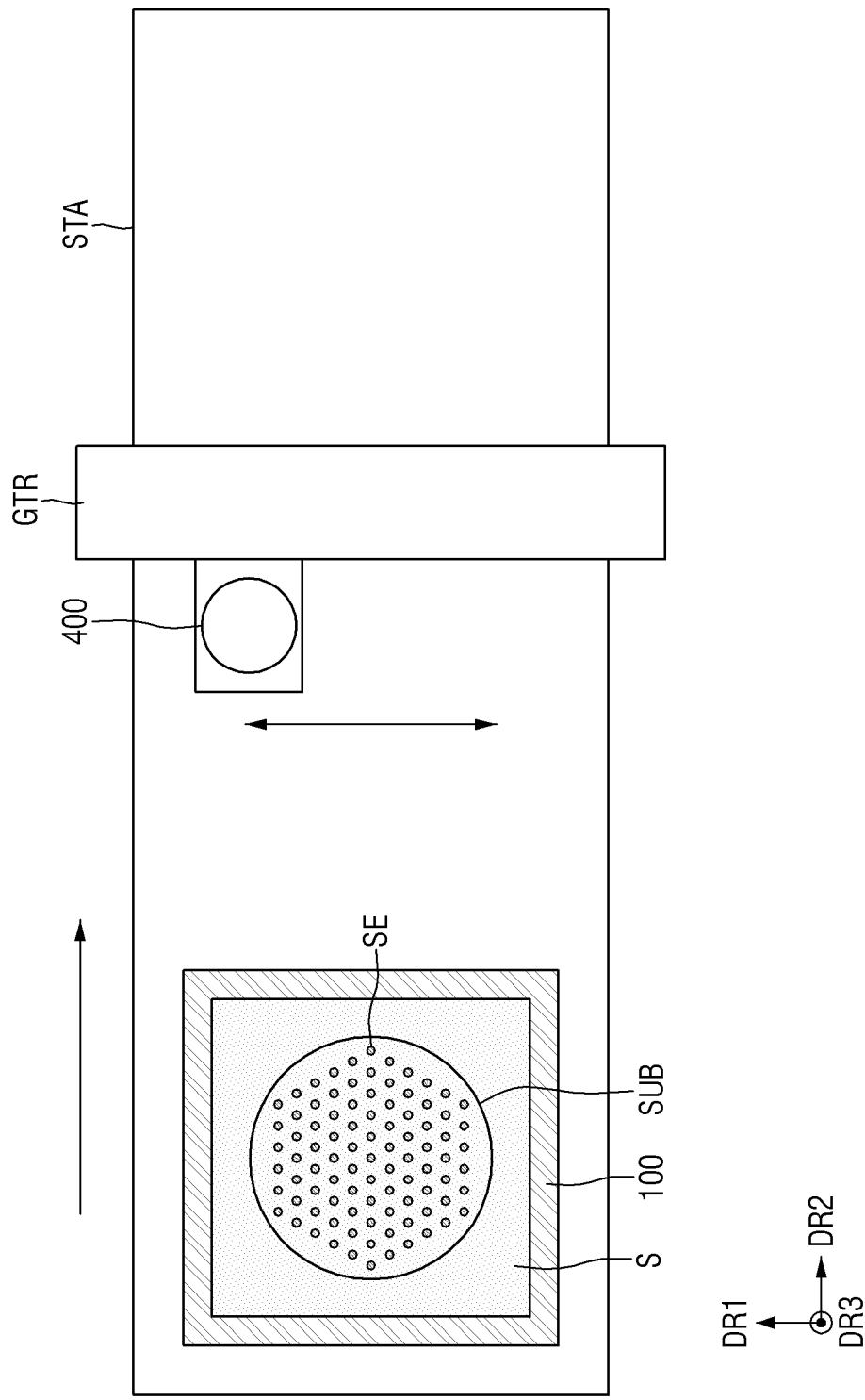
FIG. 22 is a schematic diagram showing an apparatus for separating semiconductor elements according to an embodiment.

FIG. 22 is a schematic diagram showing an apparatus for separating semiconductor elements according to an embodiment.

Referring to FIG. 22, an apparatus 20 for separating semiconductor elements may further include a stage STA for moving a base 100, and a gantry unit GTR on which a probe-type ultrasonic generator 400 may be disposed and moved, in addition to the base 100 and the probe-type ultrasonic generator 400. FIG. 22 is a plan view showing the apparatus 20 including the stage STA and the gantry unit GTR when viewed from the top.

The stage STA may be extended in the second direction DR2, and the base 100 may be disposed thereon. The base 100 may move on the stage STA in the second direction DR2 and may pass under or below the gantry unit GTR on which the probe-type ultrasonic generator 400 may be disposed. Although not shown in the drawings, the stage STA may further include a moving member that may move the base 100 disposed thereon in the second direction DR2.

The probe-type ultrasonic generator 400 may be disposed on the gantry unit GTR and located or disposed above the stage STA. For example, the probe-type ultrasonic generator 400 may be mounted on the gantry unit GTR through a moving member and may move in the first direction DR1 unlike the base 100. While the base 100 moves in the second direction DR2 on the stage STA and passes under or below the probe-type ultrasonic generator 400, the probe-type ultrasonic generator 400 may move in the first direction DR1. In a case that the probe-type ultrasonic generator 400 moves in the first direction DR1 and applies the ultrasonic waves SN to the substrate SUB, the semiconductor elements SE disposed on the substrate SUB in the first direction DR1 may be separated first. One probe-type ultrasonic generator 400 may not cover or overlap the entire substrate SUB. The semiconductor elements SE formed in other regions of the substrate SUB all may be separated while the base 100 moves in the second direction DR2.

For example, while the base 100 moves in the second direction DR2 on the stage STA, another base 100 may be disposed on the stage STA continuously. The apparatus 20 according to an embodiment may include a plurality of bases 100 to continuously perform a process of separating the semiconductor elements SE.

Figure 23:
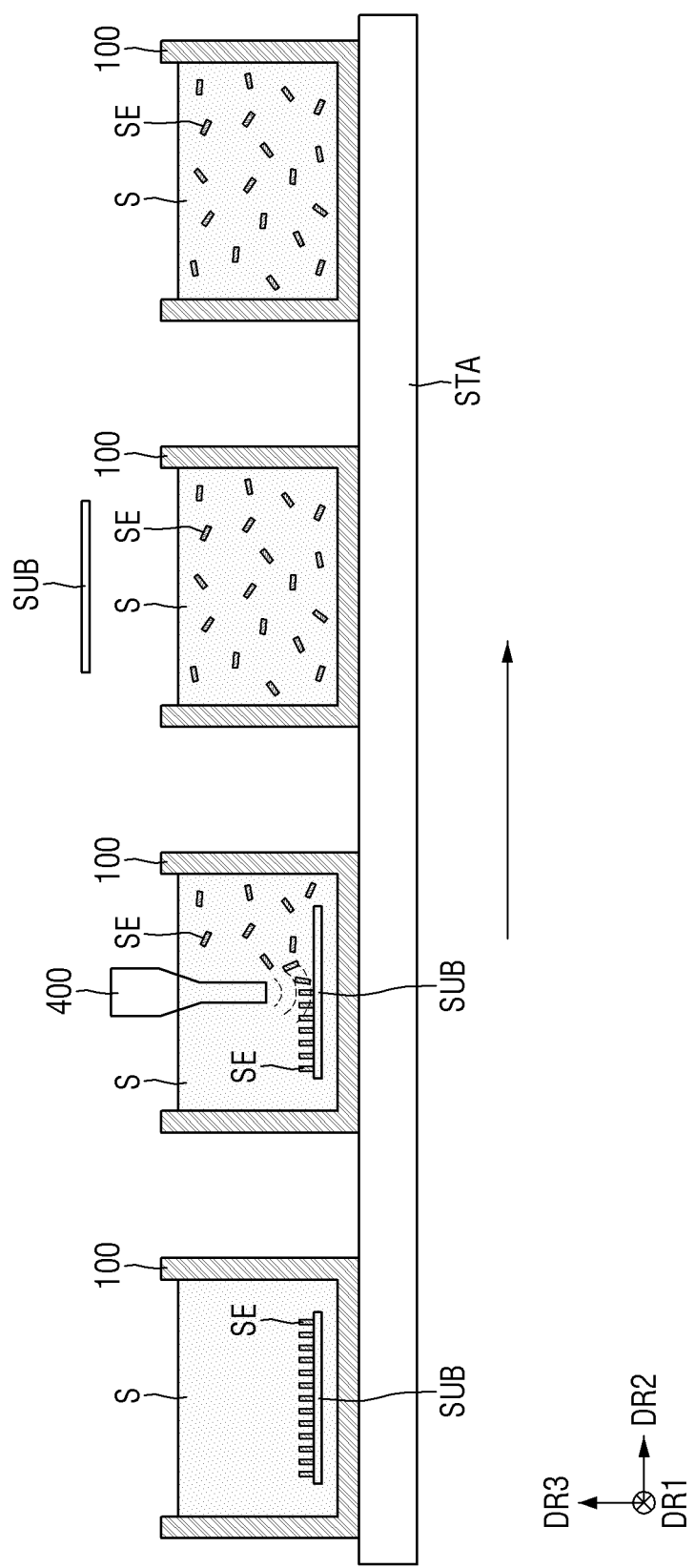
FIG. 23 is a schematic diagram showing a separating process using the apparatus for separating semiconductor elements of FIG. 22.

FIG. 23 is a schematic diagram showing a manufacturing process using the apparatus for separating semiconductor elements of FIG. 22. FIG. 23 is a side view showing the apparatus 20 of FIG. 22, showing that a plurality of bases 100 is disposed during a separation process using the apparatus 20.

Referring to FIG. 23, a plurality of bases 100 may be disposed together on a stage STA. The process of separating the semiconductor elements SE may include disposing the substrate SUB having the semiconductor elements SE formed thereon in the base 100, separating the semiconductor elements SE using the probe-type ultrasonic generator 400, removing the substrate SUB from the base 100, and separating the semiconductor elements SE from the solvent S in which the semiconductor elements SE may be dispersed. The above-described processes may be performed while one base 100 moves in the second direction DR2 on the stage STA. In a case that a base 100 moves in the second direction DR2 after one of the processes has been performed, another base 100 subsequently may be subjected to a different process on the stage STA. On the stage STA, a plurality of bases 100 may be disposed, each of which may be subjected to a different step of the separation processes. The process of separating the semiconductor elements SE may be performed continuously by using the plurality of bases 100.

In the apparatus 20 including the probe-type ultrasonic generator 400, the separation process may be performed as the probe-type ultrasonic generator 400 or the base 100 moves to separate the semiconductor elements SE from one substrate SUB. At the same time, there are advantages that the plurality of bases 100 may be continuously subjected to the separation process on the stage STA, and that the time taken for the process of separating the semiconductor elements SE may be further reduced.

The probe-type ultrasonic generator 400 may generate ultrasonic waves SN over the substrate SUB in various ways. The probe-type ultrasonic generator 400 may apply ultrasonic waves SN to a particular or predetermined region and then may move to another location or region to apply the ultrasonic waves SN again, or may move while evenly applying the ultrasonic waves SN to a large area of the substrate SUB.

Figure 24:
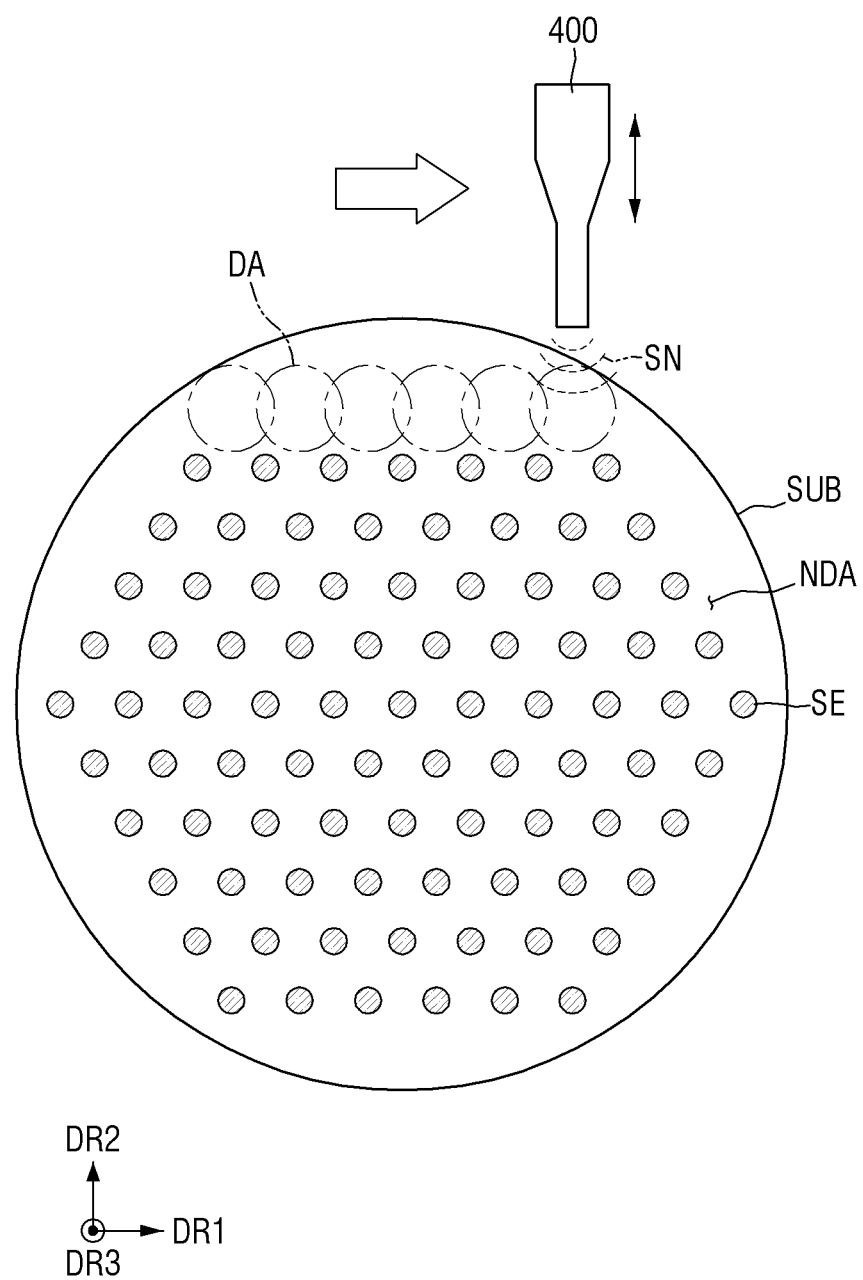
FIGS. 24 to 26 are diagrams schematically showing a process of separating semiconductor elements using the apparatus of FIG. 22.
Figure 25:
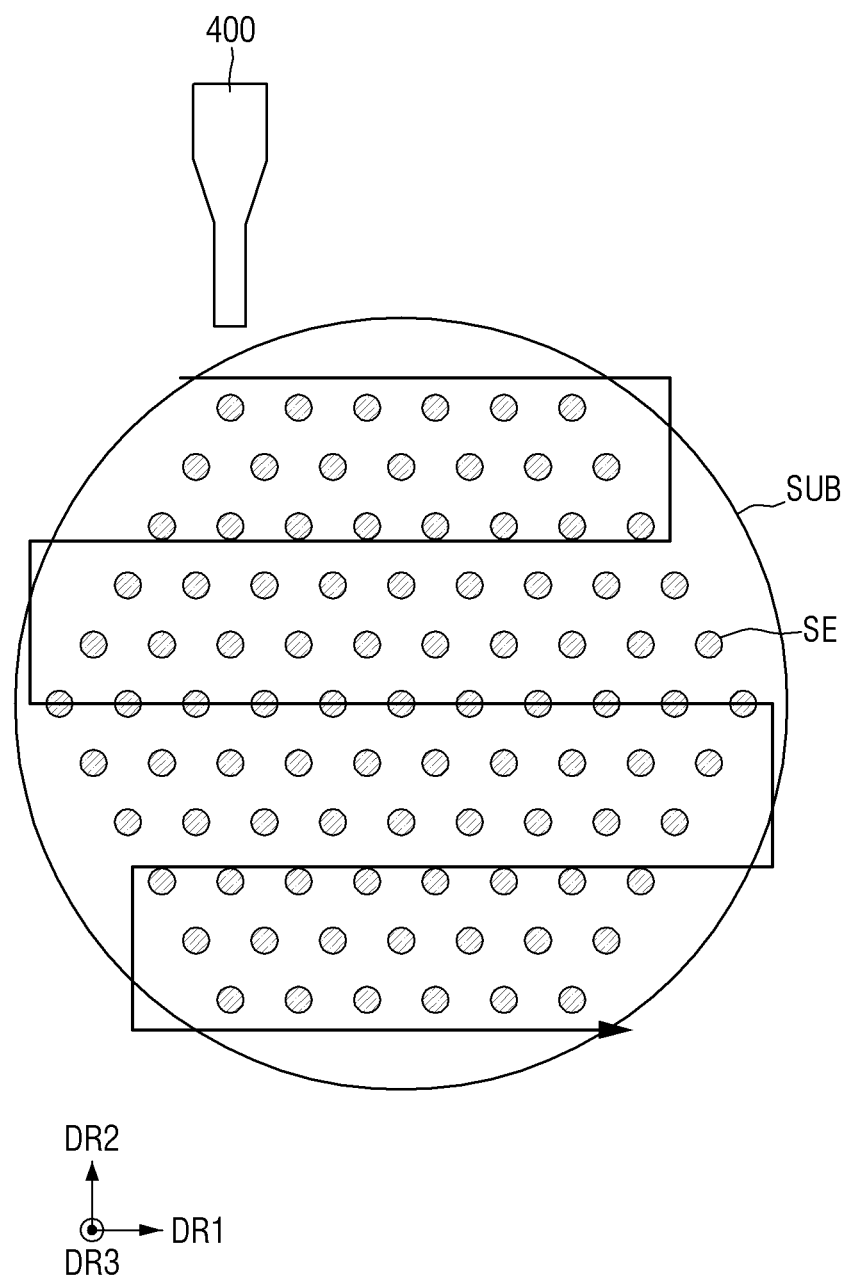
Figure 26:
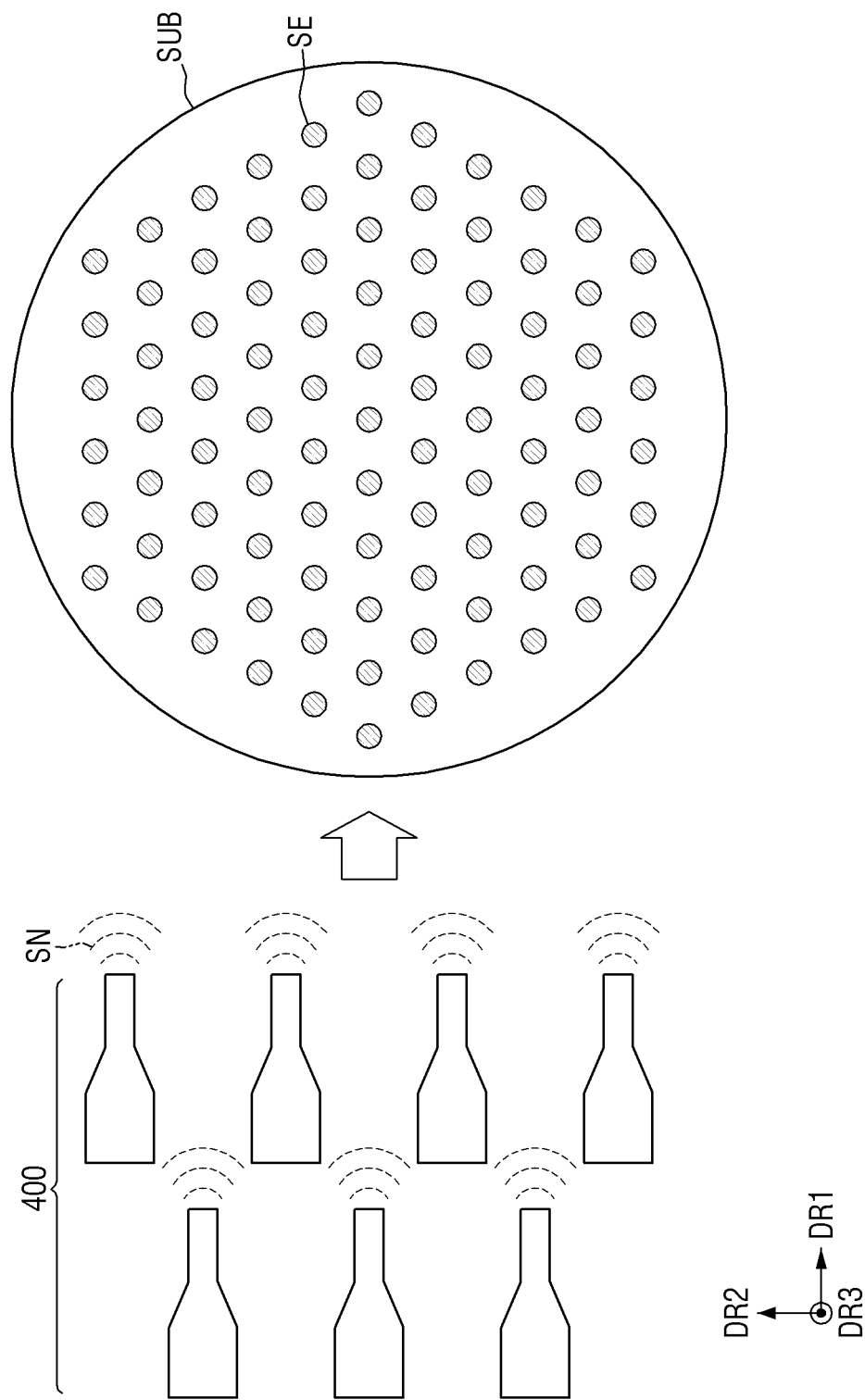

FIGS. 24 to 26 are diagrams schematically showing a process of separating semiconductor elements using the apparatus of FIG. 22.

Referring first to FIG. 24, the probe-type ultrasonic generator 400 may apply ultrasonic waves SN to a particular or predetermined area on the substrate SUB, and then may move to a different position to apply ultrasonic waves SN again, so that the semiconductor elements SE may be separated. The probe-type ultrasonic generator 400 according to an embodiment may apply ultrasonic waves SN to the substrate SUB in a stamp manner. The size or width of the probe-type ultrasonic generator 400 may be substantially smaller than that of the substrate SUB. In order to separate the semiconductor elements SE on the entire regions of the substrate SUB by using one probe-type ultrasonic generator 400, the probe-type ultrasonic generator 400 may apply ultrasonic waves SN selectively to each region while moving in the plane direction and the vertical direction (or the third direction DR3) of the substrate SUB. Regions of the substrate SUB where the ultrasonic waves SN may be applied by the probe-type ultrasonic generator 400 may become separation areas DA from which the semiconductor elements SE may be separated, and the other regions of the substrate SUB may become non-separation areas NDA. The probe-type ultrasonic generator 400 may move in the plane direction of the substrate SUB to apply ultrasonic waves SN to each region only such that the separation areas DA may overlap each other. In this manner, although the probe-type ultrasonic generator 400 may not apply the ultrasonic waves SN at the same time as it moves, all of the semiconductor elements SE may be separated throughout the entire surface of the substrate SUB.

Referring to FIGS. 25 and 26, the probe-type ultrasonic generator 400 may apply ultrasonic waves SN while moving in the plane direction of the substrate SUB. According to an embodiment of FIG. 25, one probe-type ultrasonic generator 400 may apply ultrasonic waves SN while moving in the plane direction of the substrate SUB, for example, in the first direction DR1 and the second direction DR2. According to an embodiment of FIG. 26, a plurality of probe-type ultrasonic generators 400 may apply ultrasonic waves SN while they move in a direction, for example, the first direction DR1 above the substrate SUB to a larger area. According to embodiments of FIGS. 25 and 26, different from an embodiment of FIG. 24, the probe-type ultrasonic generator 400 applies the ultrasonic waves SN while moving, there is an advantage in performing a continuous process. For example, according to an embodiment of FIG. 26, a plurality of probe-type ultrasonic generators 400 may be substantially fixed while the substrate SUB or the base 100 thereunder are moved, so that the semiconductor elements SE may be separated.

Incidentally, in the apparatuses 10 and 20, a solvent S may be disposed in the base 100 to separate the semiconductor elements SE from the substrate SUB. Once the semiconductor elements SE are dispersed in the liquid solvent S, an additional process of re-separating only the semiconductor elements SE by moving them to another container may be required. According to an embodiment, the apparatuses 10 and 20 may further include inlet pipes through which the solvent S flows into and out of the receiving portion of the base 100. After the semiconductor elements SE are separated from the substrate SUB, the solvent S in which the semiconductor elements SE are dispersed may be discharged.

Figure 27:
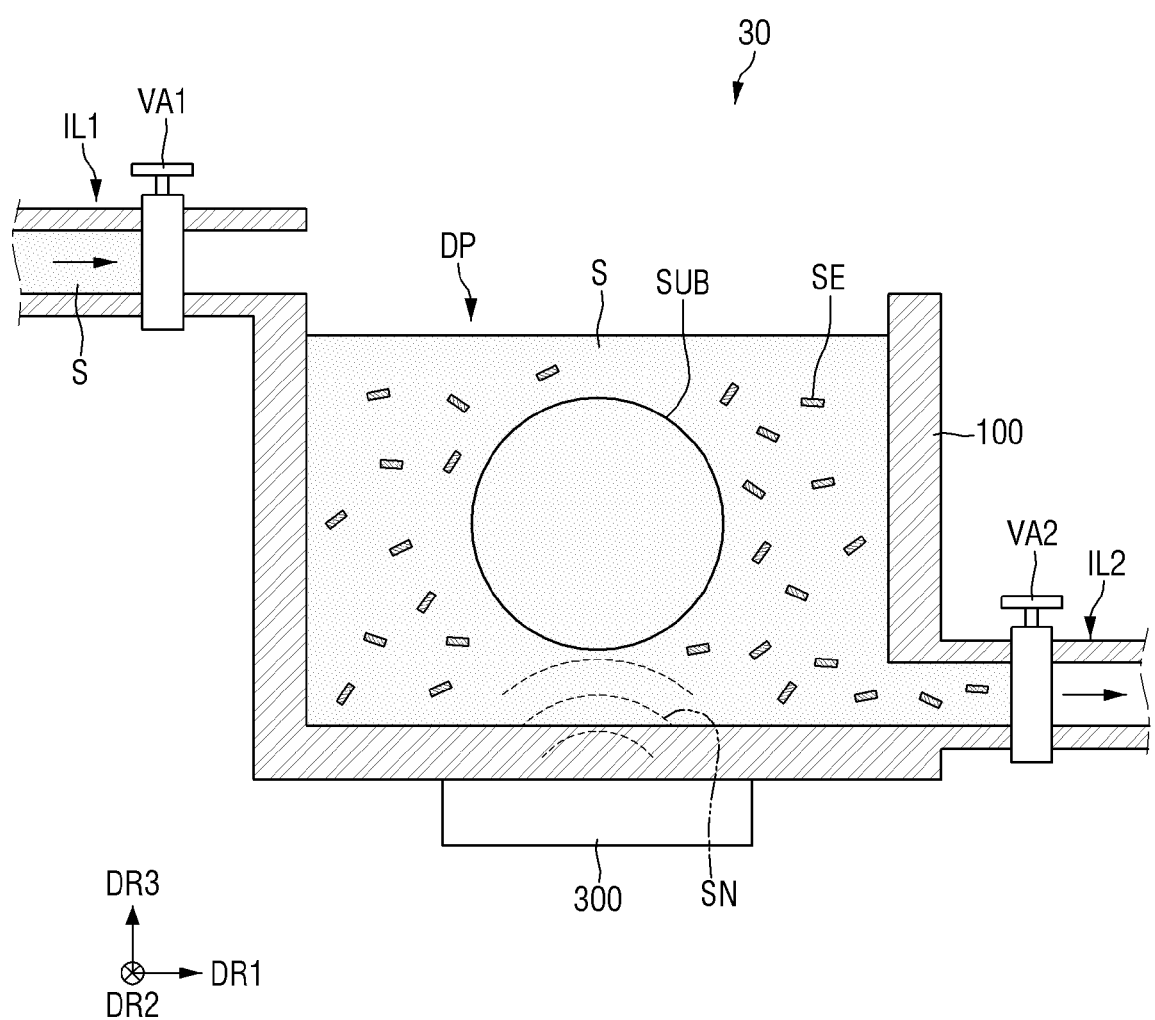
FIGS. 27 to 28 are schematic diagrams showing an apparatus for separating semiconductor elements according to an embodiment.
Figure 28:
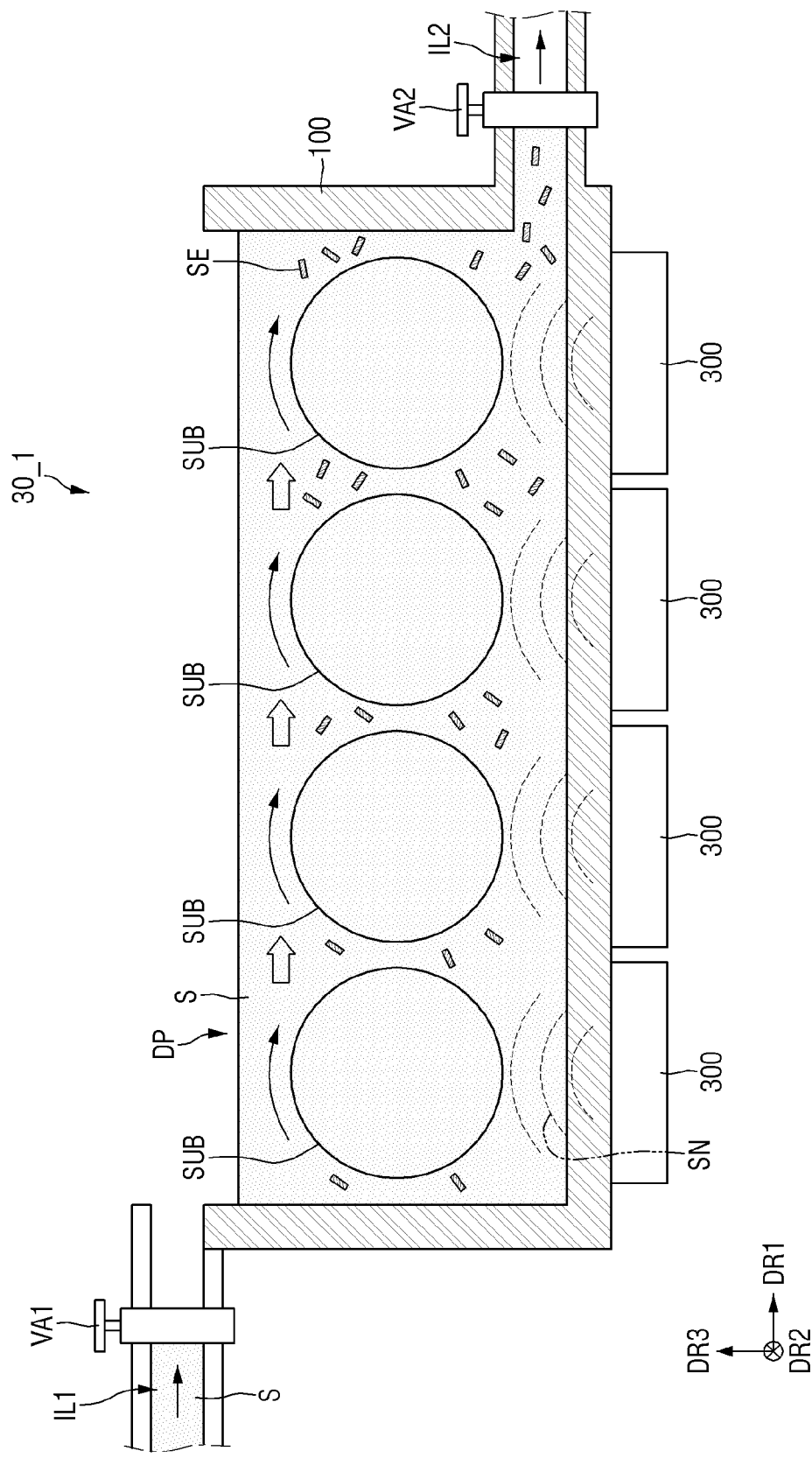

FIGS. 27 to 28 are schematic diagrams showing apparatuses for separating semiconductor elements according to embodiments.

Referring to FIGS. 27 and 28, each of apparatuses 30 and 30_1 for separating semiconductor elements may further include a first inlet pipe IL1 for introducing a solvent S into a receiving portion DP of a base 100 in which a substrate SUB may be disposed and the semiconductor elements SE may be separated from it, and a second inlet pipe IL2 for discharging the solvent S in which the semiconductor elements SE may be dispersed from the receiving portion DP. The apparatus 30 according to an embodiment of FIG. 27 may include one ultrasonic waves generator 300 disposed at the bottom of the receiving portion DP, while the apparatus 30_1 according to an embodiment of FIG. 28 may include a plurality of ultrasonic waves generators 300 so that more substrates SUBs may be processed simultaneously. Hereinafter, an embodiment of FIG. 27 will be described in detail.

The receiving portion DP of the base 100 may be substantially identical to that of each of the above-described embodiments. A solvent S and a substrate SUB for the separation process may be disposed in the receiving portion DP. The ultrasonic waves SN generated from an ultrasonic generator 300 disposed at the bottom of the base 100 may be applied to the receiving portion DP.

A first inlet pipe IL1 and a second inlet pipe IL2 may be connected to the receiving portion DP of the base 100. The first inlet pipe IL1 may be connected to one or a side of the receiving portion DP, and the second inlet pipe IL2 may be connected to the other or another side thereof. The first inlet pipe IL1 may be located or disposed higher than the second inlet pipe IL2 in cross section. A first valve VA1 may be disposed between the first inlet pipe IL1 and the receiving portion DP, and a second valve VA2 may be disposed between the second inlet pipe IL2 and the receiving portion DP. The flow rate of the solvent S flowing into and out of the receiving portion DP may be adjusted. In the drawings, the first valve VA1 and the second valve VA2 may block the inflow and discharge of the solvent S, respectively.

In order to perform the process of separating the semiconductor elements SE, the solvent S is introduced into the receiving portion DP through the first inlet pipe ILL and the substrate SUB on which the semiconductor elements SE are formed is prepared. At this time, the second valve VA2 is closed and thus the solvent S may not be discharged from the receiving portion DP. The ultrasonic generator 300 generates ultrasonic waves SN to separate the semiconductor elements SE, and then the substrate SUB is removed. Subsequently, the solvent S in which the semiconductor elements SE may be dispersed may be discharged through the second inlet pipe IL2. At this time, the first valve VA1 is closed and thus the solvent S may not be introduced into the receiving portion DP. In a case that all of the semiconductor elements SE and the solvent S are discharged through the second inlet pipe IL2, the above-described steps may be repeated to perform the process of separating the semiconductor elements SE. According to an embodiment including the inlet pipes IL1 and IL2 connected to the receiving portion DP, a subsequent process of separating the semiconductor elements SE from the solvent S may be continuously performed. The solvent S may be repeatedly introduced into and discharged from the receiving portion DP, and the semiconductor element SE may be separated from another substrate SUB while the semiconductor elements dispersed in the solvent are separated from it. As a result, there is an advantage in that the time taken between separation processes may be shortened and the entire process time may be reduced.

Figure 29:
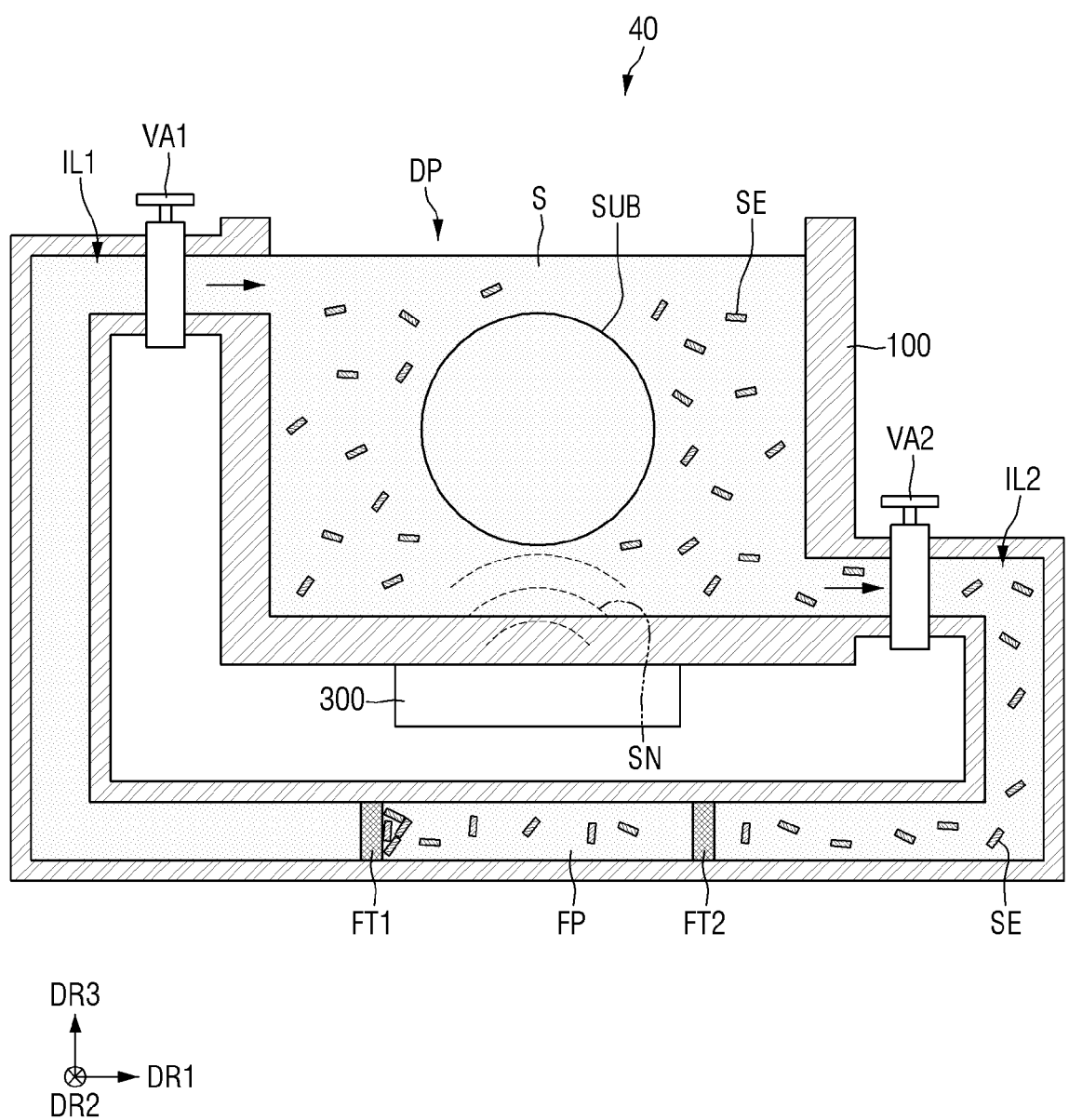
FIGS. 29 to 31 are schematic diagrams showing apparatuses for separating semiconductor elements according to embodiments.
Figure 30:
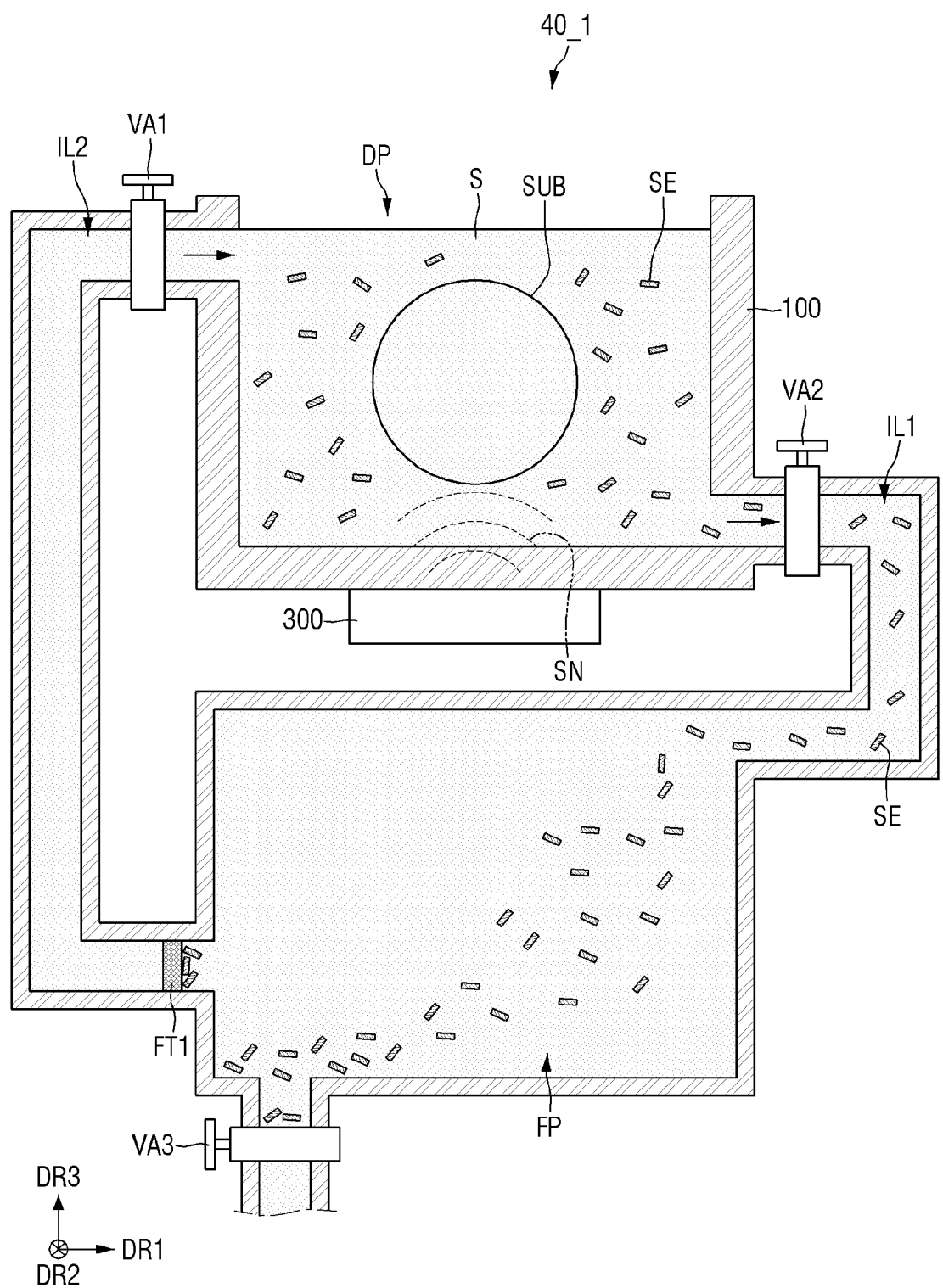
Figure 31:
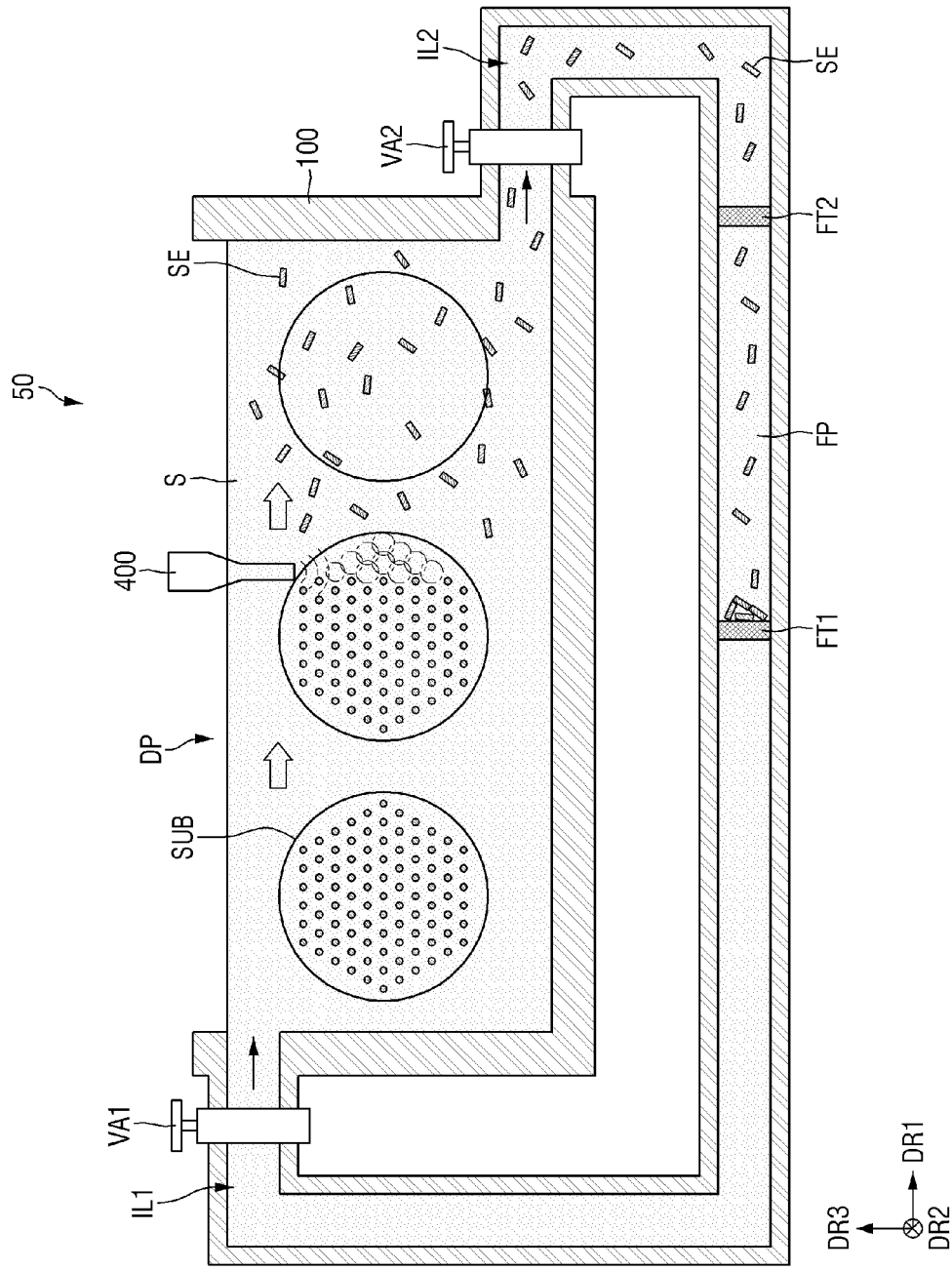

FIGS. 29 to 31 are schematic diagrams showing apparatuses for separating semiconductor elements according to embodiments.

Referring to FIG. 29, an apparatus 40 for separating semiconductor elements according to an embodiment may further include a filter part connected between inlet pipes IL1 and IL2 connected to the receiving portion DP of the base 100. The first inlet pipe IL1 and the second inlet pipe IL2 may be connected to each other through the filter part FP. The apparatus 40 may include a system in which a constant amount of solvent S may be circulated. An embodiment may be different from an embodiment of FIG. 27 in that the apparatus 40 may further include the filter part FP. In the following description, descriptions will focus on the difference, and the redundant description will be omitted.

The apparatus 40 may include the inlet pipes IL1 and IL2 connected to the receiving portion DP of the base 100, and the filter part FP, through which the solvent S flows. The first inlet pipe IL1 may be connected to one or a side of the receiving portion DP, and the second inlet pipe IL2 may be connected to the other or another side of the receiving portion DP. The filter part FP may be connected between the first inlet pipe IL1 and the second inlet pipe IL2. The solvents S flowing into the receiving portion DP may be introduced from the first inlet pipe IL1 and discharged through the second inlet pipe IL2, and then may flow back to the first inlet pipe IL1 through the filter part FP. In the drawing, the first valve VA1 and the second valve VA2 are opened and the solvent or solvents S flow. During the process of separating the semiconductor elements SE, the valves VA1 and VA2 may be closed and the solvent S may not flow. It is, however, to be understood that the disclosure is not limited thereto. The valves VA1 and VA2 may be kept open regardless of the steps of the separation process, and may be eliminated in some implementations.

According to an embodiment, a plurality of filters FT1 and FT2 may be disposed at the entrance and the exit of the filter part FP or at the portions connected to the inlet pipes IL1 and IL2. A first filter FT1 may be disposed between the filter part FP and the first inlet pipe ILL and a second filter FT2 may be disposed between the filter part FP and the second inlet pipe IL2. The semiconductor elements SE separated from the substrate SUB and other foreign substances together with the solvent S may be discharged through the second inlet pipe IL2. The first filter FT1 and the second filter FT2 may filter particles contained in the solvent S flowing from the second inlet pipe IL2, and only the solvent S may be introduced into the first inlet pipe IL1. Therefore, the solvent S may be reused.

According to an embodiment, the first filter FT1 may filter smaller particles than particles filtered by the second filter FT2. The solvent S introduced into the filter part FP through the second inlet pipe IL2 may further include a plurality of semiconductor elements SE and other foreign substances. The second filter FT2 may not filter out the semiconductor elements SE but may filter out foreign substances having a larger size. Foreign substances created during the process of separating the semiconductor elements SE from the substrate SUB may be separated by the second filter FT2. Smaller particles including the semiconductor elements SE may be introduced into the filter part FP.

The first filter FT1 may filter out particles having a size similar to that of the semiconductor elements SE, and particles smaller than them may pass through the first filter FT1. While the solvents S pass through the filter part FP and flow into the first inlet pipe ILL the semiconductor elements SE dispersed in the solvent S may be accumulated at the first filter FT1. After the process of separating the semiconductor elements SE is sufficiently performed, the semiconductor elements SE may be separated by removing only the first filter FT1. According to an embodiment, the apparatus 40 may further include the filter part FP and the plurality of filters FT1 and FT2, so that it may be possible to separate the semiconductor elements SE from the substrate SUB and from the solvent S simultaneously.

Referring to FIG. 30, an apparatus 40_1 for separating semiconductor elements according to an embodiment may include a filter part FP having a larger capacity, and may further include a third valve VA3 connected to the filter part FP. An embodiment of FIG. 30 may be different from an embodiment of FIG. 29 in that the size of the filter part FP may be different and that the third valve VA3 may be further included. For example, the second filter FT2 may be eliminated, such that the semiconductor elements SE and other foreign substances together may flow into the filter part FP. If it is not easy to remove the first filter FT1 from the filter part FP, in a case that the semiconductor elements SE may be accumulated at the filter part FP, they may be discharged through the third valve VA3. In a case that the semiconductor elements SE are discharged together with the solvent S and foreign substances, only the semiconductor elements SE may be separated through a separate process. According to an embodiment, the apparatus 40_1 may include only the first filter FT1, and the semiconductor elements SE may be separated during a separate process, so that the semiconductor elements SE of higher purity may be obtained.

Referring to FIG. 31, an apparatus 50 for separating semiconductor elements according to an embodiment may include a probe-type ultrasonic generator 400 to form a system in which the solvent S may circulate. An embodiment may be different from an embodiment of FIG. 29 in that the former may further include the ultrasonic generator 400. In the following description, the redundant description will be omitted.

As described above, the semiconductor elements SE may be formed on the substrate SUB by the epitaxial growth. Some or a number of them may be defective elements that fail to meet the quality requirements. Alternatively, unnecessary foreign substances may remain on the substrate SUB during the process of forming the semiconductor elements SE. As in an embodiment of FIG. 18, in a case that the apparatus 20 may include the probe-type ultrasonic generator 400, the process of removing defective elements and foreign substances may be carried out prior to the process of separating the semiconductor elements SE.

Figure 32:
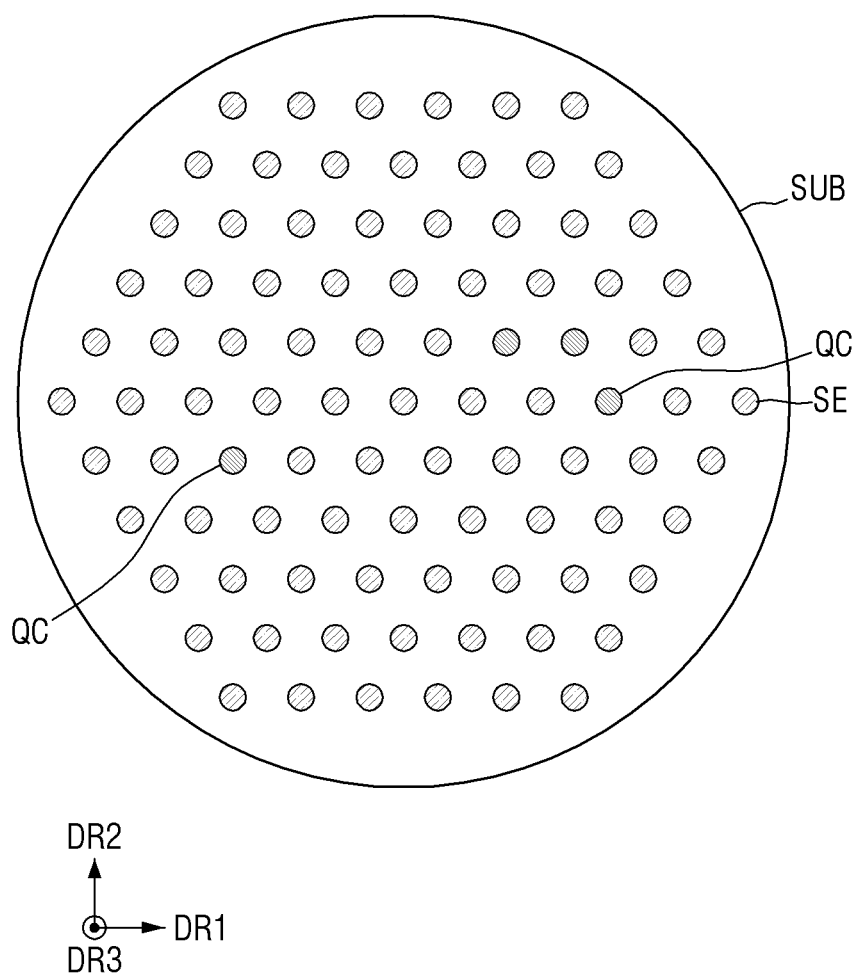
FIG. 32 is a plan view showing a substrate on which semiconductor elements are formed according to an embodiment.
Figure 33:
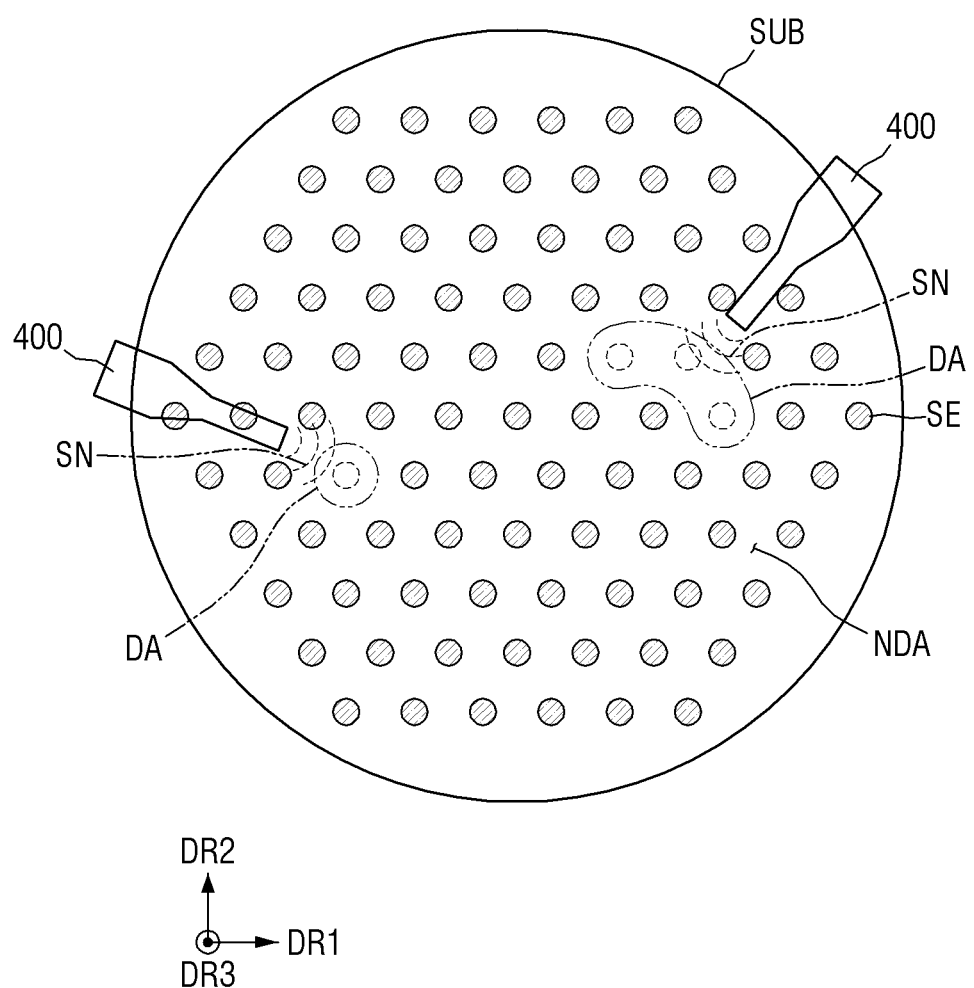
FIGS. 33 and 34 are schematic diagrams showing a part of a process of separating the semiconductor elements using the substrate of FIG. 32.
Figure 34:
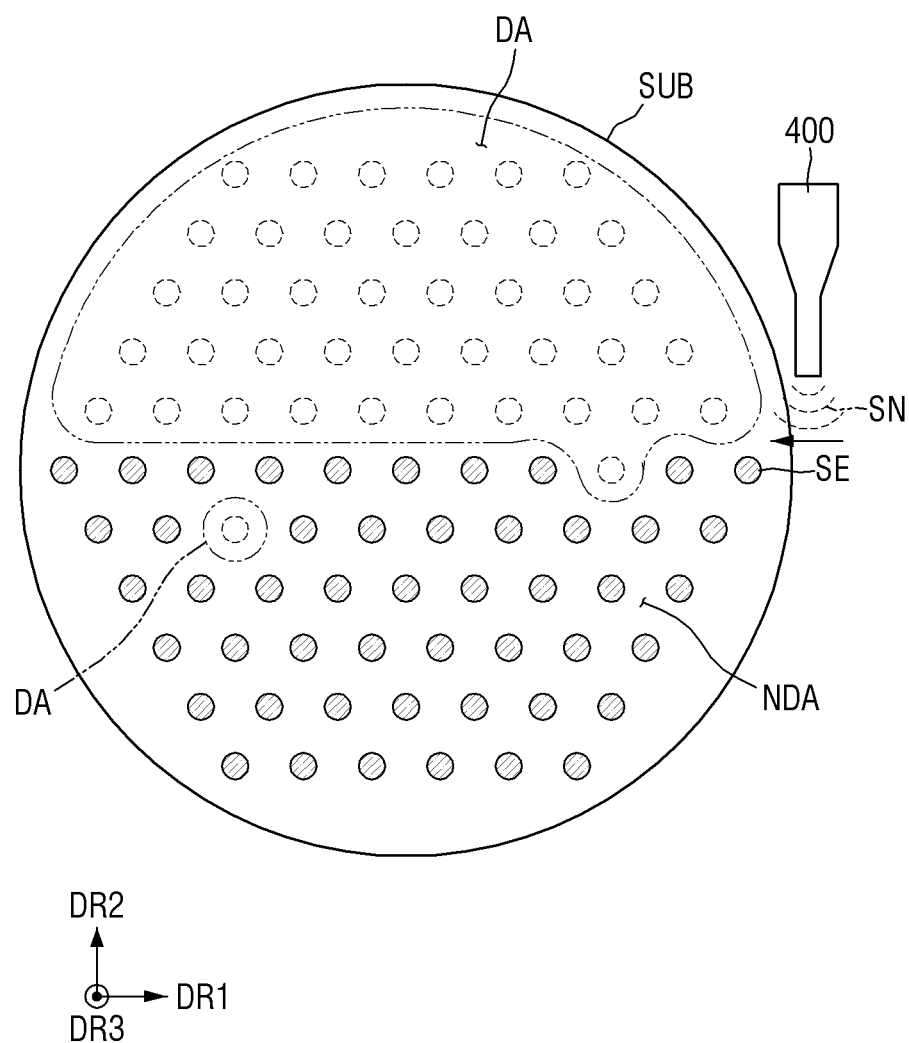

FIG. 32 is a plan view showing a substrate on which semiconductor elements are formed according to an embodiment. FIGS. 33 and 34 are schematic diagrams showing a part of a process of separating the semiconductor elements using the substrate of FIG. 32.

Referring to FIG. 32, there may be some or a number of defective elements QC on the substrate SUB, in addition to the plurality of semiconductor elements SE. Defective elements QC may look defective compared to the semiconductor elements SE or may fail to meet the requirements of other characteristics, and may be distinguished from the other semiconductor elements SE. For example, the defective elements QC may not have a neat or uniform appearance or may have different sizes compared to other semiconductor elements SE. For example, in embodiments, the semiconductor elements SE may be light-emitting devices that emit light, whereas the defective elements QC may not emit light or may have a wavelength band different from that of other light-emitting devices. If such defective elements QC are separated together with and mixed with other semiconductor elements SE, it may not be easy to extract only the defective elements QC from the separated semiconductor elements SE. If a device including semiconductor elements SE is produced, the reliability of the device may deteriorate due to such defective elements QC. According to an embodiment, during the process of separating the semiconductor elements SE, a process of inspecting the semiconductor elements SE on the substrate SUB to identify defective elements QC, and a process of separating them may be carried out in advance.

Referring to FIG. 33, a process of separating the defective elements QC formed on the substrate SUB by using the apparatus 20 of FIG. 18 may be carried out in advance. As described above, the probe-type ultrasonic generator 300 may selectively apply ultrasonic waves SN to particular or predetermined regions. As in an embodiment of FIG. 24, in a case that the probe-type ultrasonic generator 300 applies ultrasonic waves SN in a stamp manner, it may be possible to selectively remove only defective elements QC without separating other nearby semiconductor elements SE. Regions of the substrate SUB where the ultrasonic waves SN may be applied by the probe-type ultrasonic generator 300 to remove the defective elements QC may become separation areas DA, and the other regions of the substrate SUB where the semiconductor elements SE may be disposed may become non-separation areas NDA.

Subsequently, referring to FIG. 34, the above-described process of separating the semiconductor elements SE may be performed using the substrate SUB from which the defective elements QC have been removed. In this process, in a case that the probe-type ultrasonic generator 300 moves and separates the semiconductor elements SE formed on the substrate SUB, only the semiconductor elements SE that meets the requirements of physical properties may be separated. Accordingly, the quality of the separated semiconductor elements SE may be improved, and the reliability of a device using the same may be improved.

Figure 35:
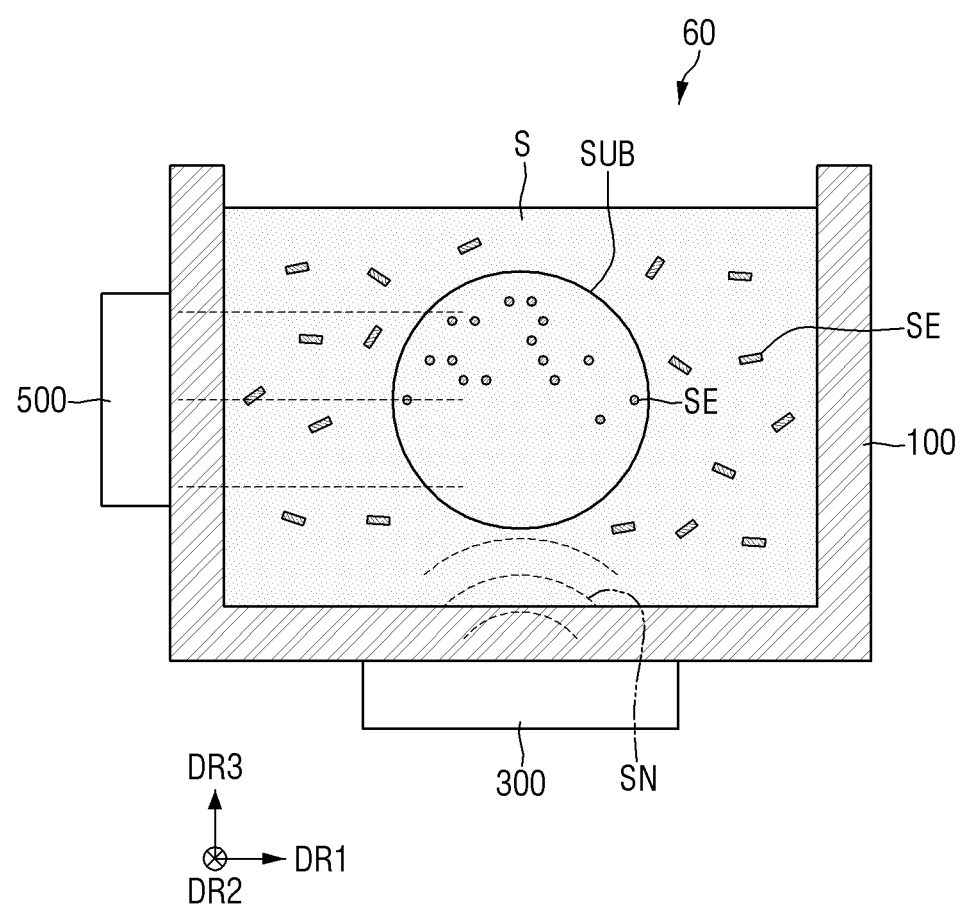
FIG. 35 is a schematic diagram showing an apparatus for separating semiconductor elements according to an embodiment.

FIG. 35 is a schematic diagram showing an apparatus for separating semiconductor elements according to an embodiment.

Referring to FIG. 35, an apparatus 60 for separating semiconductor elements may further include a measurement unit 500 that measures the degree of separation of the semiconductor elements SE. The measurement unit 500 may be disposed on one of the sidewalls of the base 100. It is, however, to be understood that the disclosure is not limited thereto. The measurement unit 500 may be implemented as a member separated from the base 100, similarly to the probe-type ultrasonic generator 400 of FIG. 18. The measurement unit 500 may measure the degree of separation of semiconductor elements SE on the substrate SUB subjected to the separation process in the base 100.

For example, the measurement unit 500 may irradiate light onto the substrate SUB on which the separation process is being performed, and may measure the number of semiconductor elements SE which are not separated and remaining based on the transmittance of the light. According to an embodiment, the measurement unit 500 may capture the substrate SUB on which the separation process is being carried out and may measure the number of remaining semiconductor elements SE which are not separated.

The measurement unit 500 may calculate the degree of separation based on the number of semiconductor elements SE remaining on the substrate SUB, and may send a feedback signal on this to control the separation process using the ultrasonic generator 300. The degree of separation may be expressed as a numerical value indicative of how many of the semiconductor elements SE are separated based on the substrate SUB on which the semiconductor elements SE are formed. For example, the measurement unit 500 may calculate the degree of separation of the semiconductor elements SE by measuring the number or transmittance of the semiconductor elements SE remaining on the substrate SUB after the separation process relative to the number or transmittance of the semiconductor elements SE formed on the substrate SUB before the separation process. The apparatus 60 may further include the measurement unit 500 to flexibly change the process conditions of the separation process of the semiconductor elements SE, and may separate most of the semiconductor elements SE from each substrate, so that the yield of the fabricating process may be improved.

Incidentally, the above-described semiconductor elements SE may be inorganic light-emitting elements each including a plurality of semiconductor layers and an emissive layer. According to an embodiment, a light-emitting element may be fabricated using the apparatus 10 for separating semiconductor elements.

Figure 36:
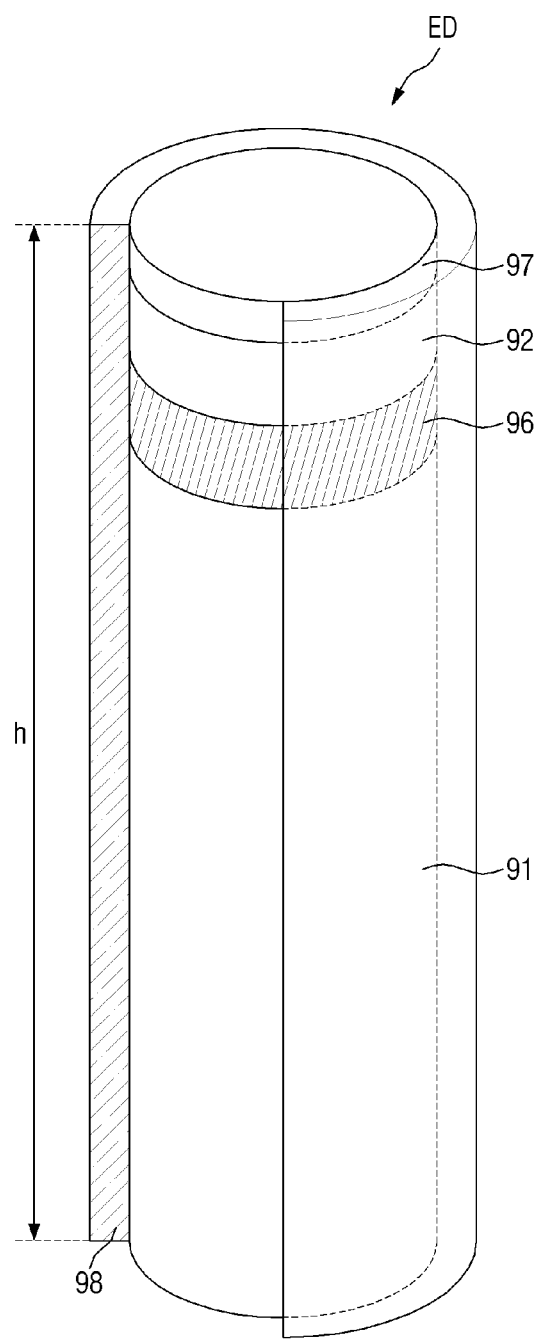
FIG. 36 is a view showing a light-emitting element according to an embodiment.

FIG. 36 is a view showing a light-emitting element according to an embodiment.

The light-emitting diode ED may be a light-emitting diode. By way of example, the light-emitting elements ED may have size from micrometers to nanometers and may be inorganic light-emitting diodes made of an inorganic material. Inorganic light-emitting diodes may be aligned between two electrodes facing each other as polarities are created by forming an electric field in a particular or predetermined direction between the two electrodes. The light-emitting diode ED may be aligned between two electrodes by an electric field formed over the two electrodes.

The light-emitting diode ED according to an embodiment may have a shape extended in one direction. The light-emitting diode ED may have a shape substantially of a rod, wire, tube, for example, within the spirit and the scope of the disclosure. In an embodiment, the light-emitting diode ED may have a substantially cylindrical or rod-like shape. It is to be understood that the shape of the light-emitting diode ED is not limited thereto. The light-emitting diode ED may have a variety of shapes including a substantially polygonal column shape such as a cube, a cuboid and a hexagonal column, or a shape that may be extended in a direction with partially inclined outer surfaces. The plurality of semiconductors included in the light-emitting diode ED to be described later may have a structure sequentially arranged or disposed or stacked along the one direction.

The light-emitting diode ED may include semiconductor layers doped with impurities of a conductive type (for example, p-type or n-type). The semiconductor layers may emit light of a certain or predetermined wavelength band by transmitting an electric signal applied from an external power source.

As shown in FIG. 36, the light-emitting diode ED may include a first semiconductor layer 91, a second semiconductor layer 92, an emissive layer 96, an electrode layer 97 and an insulating layer 98.

The first semiconductor layer 91 may be an n-type semiconductor. For example, in a case that the light-emitting diode ED emits light of a blue wavelength band, the first semiconductor layer 91 may include a semiconductor material having the following chemical formula: $Al_xGa_yIn_{1-x-y}N$ ($0 \le x \le 1$, $0 \le y \le 1$, $0 \le x+y \le 1$). For example, it may be at least one of n-type doped AlGaInN, GaN, AlGaN, InGaN, AlN and InN. The first semiconductor layer 91 may be doped with an n-type dopant, and the n-type dopant may be Si, Ge, Sn, etc., for example. According to an embodiment, the first semiconductor layer 91 may be n-GaN doped with n-type Si. The length of the first semiconductor layer 91 may range, but is not limited to, from about 1.5 μm to about 5 μm.

The second semiconductor layer 92 may be disposed on the emissive layer 96 to be described later. The second semiconductor layer 92 may be a p-type semiconductor. For example, in a case that the light-emitting diode 300 emits light of a blue or green wavelength band, the second semiconductor layer 92 may include a semiconductor material having the following chemical formula: $Al_xGa_yIn_{1-x-y}N$ ($0 \le x \le 1$, $0 \le y \le 1$, $0 \le x+y \le 1$). For example, it may be at least one of p-type doped AlGaInN, GaN, AlGaN, InGaN, AlN and InN. The second semiconductor layer 92 may be doped with a p-type dopant, and the p-type dopant may be Mg, Zn, Ca, Se, Ba, etc., for example. According to an embodiment, the second semiconductor layer 92 may be p-GaN doped with p-type Mg. The length of the second semiconductor layer 92 may range, but is not limited to, from about 0.05 μm to about 0.10 μm.

Although each of the first semiconductor layer 91 and the second semiconductor layer 92 is implemented as a signal layer in the drawings, the disclosure is not limited thereto. According to embodiments, depending on the material of the emissive layer 96, the first semiconductor layer 91 and the second semiconductor layer 92 may further include a larger number of layers, for example, a clad layer or a tensile strain barrier reducing (TSBR) layer.

The emissive layer 96 may be disposed between the first semiconductor layer 91 and the second semiconductor layer

92. The emissive layer 96 may include a material having a single or multiple quantum well structure. In a case that the emissive layer 96 may include a material having the multiple quantum well structure, the structure may include quantum layers and well layers alternately stacked on one another. The emissive layer 96 may emit light as electron-hole pairs are combined therein in response to an electrical signal applied through the first semiconductor layer 91 and the second semiconductor layer 92. For example, in a case that the emissive layer 96 emits light of the blue wavelength band, it may include a material such as AlGaN and AlGaInN. For example, in a case that the emissive layer 96 has a multi-quantum well structure in which quantum layers and well layers may be alternately stacked on one another, the quantum layers may include AlGaN or AlGaInN, and the well layers may include a material such as GaN and AlGaN. According to an embodiment, the emissive layer 96 may include AlGaInN as the quantum layer and AlInN as the well layer, and, the emissive layer 96 may emit blue light having a center wavelength band of about 450 nm to about 495 nm.

It is, however, to be understood that the disclosure is not limited thereto. The emissive layer 96 may have a structure in which a semiconductor material having a large band gap energy and a semiconductor material having a small band gap energy may be alternately stacked on one another, and may include other Group III to Group V semiconductor materials depending on the wavelength range of the emitted light. Accordingly, the light emitted from the emissive layer 96 is not limited to the light of the blue wavelength band. The emissive layer 36 may emit light of red or green wavelength band in some implementations. The length of the emissive layer 96 may be, but is not limited to, in the range of about 0.05 μm to about 0.10 μm.

The light emitted from the emissive layer 96 may exit not only through the outer surfaces of the light-emitting diode ED in the longitudinal direction but also through the both side surfaces. The direction in which the light emitted from the emissive layer 96 propagates is not limited to one direction.

The electrode layer 97 may be an ohmic contact electrode. It is, however, to be understood that the disclosure is not limited thereto. The element electrode layer may be Schottky contact electrodes. The light-emitting diode ED may include at least one electrode layer 97. Although the light-emitting diode ED may include one electrode layer 97 in the example shown in FIG. 36, the disclosure is not limited thereto. In some implementations, the light-emitting diode ED may include a larger number of electrode layers 97 or the electrode layer may be omitted. The following description on the light-emitting diode ED may be equally applied even if the number of electrode layers 97 may be different or if it may further include other structures.

The electrode layer 97 may reduce the resistance between the light-emitting diode ED and an electrode in a case that the light-emitting diode ED may be electrically connected to the electrode. The electrode layer 97 may include a metal having conductivity. For example, the electrode layer 97 may include at least one of aluminum (Al), titanium (Ti), indium (In), gold (Au), silver (Ag), indium tin oxide (ITO), indium zinc oxide (IZO) and indium tin-zinc oxide (ITZO). For example, the electrode layer 97 may include a semiconductor material doped with n-type or p-type impurities. It is, however, to be understood that the disclosure is not limited thereto.

The insulating layer 98 may be disposed to surround the outer surfaces of the plurality of semiconductor layers and electrode layers. According to an embodiment, the insulating layer 98 may be disposed to surround at least the outer surface of the emissive layer 96, and may be extended in a direction in which the light-emitting diode ED may be extended. The insulating layer 98 may serve to protect the above-described elements. For example, the insulating layer 98 may be formed to surround the side surfaces of the elements, and both ends of the light-emitting diode ED in the longitudinal direction may be exposed.

Although the insulating layer 98 may be extended in the longitudinal direction of the light-emitting diode ED to cover or overlap from the first semiconductor layer 91 to the side surface of the electrode layer 97 in the example shown in the drawing, the disclosure is not limited thereto. The insulating layer 98 may cover or overlap only the outer surface of a part of the semiconductor layer in addition to the emissive layer 96, or may cover or overlap only a part of the outer surface of the electrode layer 97 to partially expose the outer surface of the electrode layer 97. For example, a part of the upper surface of the insulating layer 98 may be rounded which may be adjacent to at least one end of the light-emitting diode ED in cross section.

The thickness of the insulating layer 98 may be, but is not limited to, in the range of about 10 nm to about 1.0 μm. As an example, the thickness of the insulating layer 98 may be approximately 40 nm.

The insulating layer 98 may include materials having insulating properties such as silicon oxide (SiOx), silicon nitride (SiNx), silicon oxynitride (SiOxNy) and aluminum nitride (AlN). Accordingly, it may be possible to prevent an electrical short-circuit that may occur in a case that the emissive layer 96 electrically contacts an electrode through which an electric signal is transmitted to the light-emitting diode ED. For example, since the insulating layer 98 may include the emissive layer 96 to protect the outer surface of the light-emitting diode ED, it may be possible to prevent a decrease in luminous efficiency.

For example, in embodiments, the outer surface of the insulating layer 98 may be subjected to surface treatment. The light-emitting diodes ED may be dispersed in an ink, and the ink may be sprayed onto the electrode. In doing so, a surface treatment may be applied to the insulating layer 98 so that it becomes hydrophobic or hydrophilic in order to keep the light-emitting diodes ED dispersed in the ink from being aggregated with one another.

The length h of the light-emitting diodes ED may range from about 1 μm to about 10 μm or from about 2 μm to about 6 μm, and also approximately about 3 μm to about 5 μm. For example, the diameter of the light-emitting diodes ED may range from about 30 nm to about 700 nm, and the aspect ratio of the light-emitting diodes ED may range from about 1.2 to about 100. It is, however, to be understood that the disclosure is not limited thereto. The plurality of light-emitting diodes ED may have different diameters for different compositions of the emissive layer 96. Preferably, the diameter of the light-emitting diodes ED may be approximately 500 nm.

The light-emitting diode ED including a plurality of semiconductor layers may be fabricated by the epitaxial growth in which seed crystals may be grown on the substrate SUB.

Figure 37:
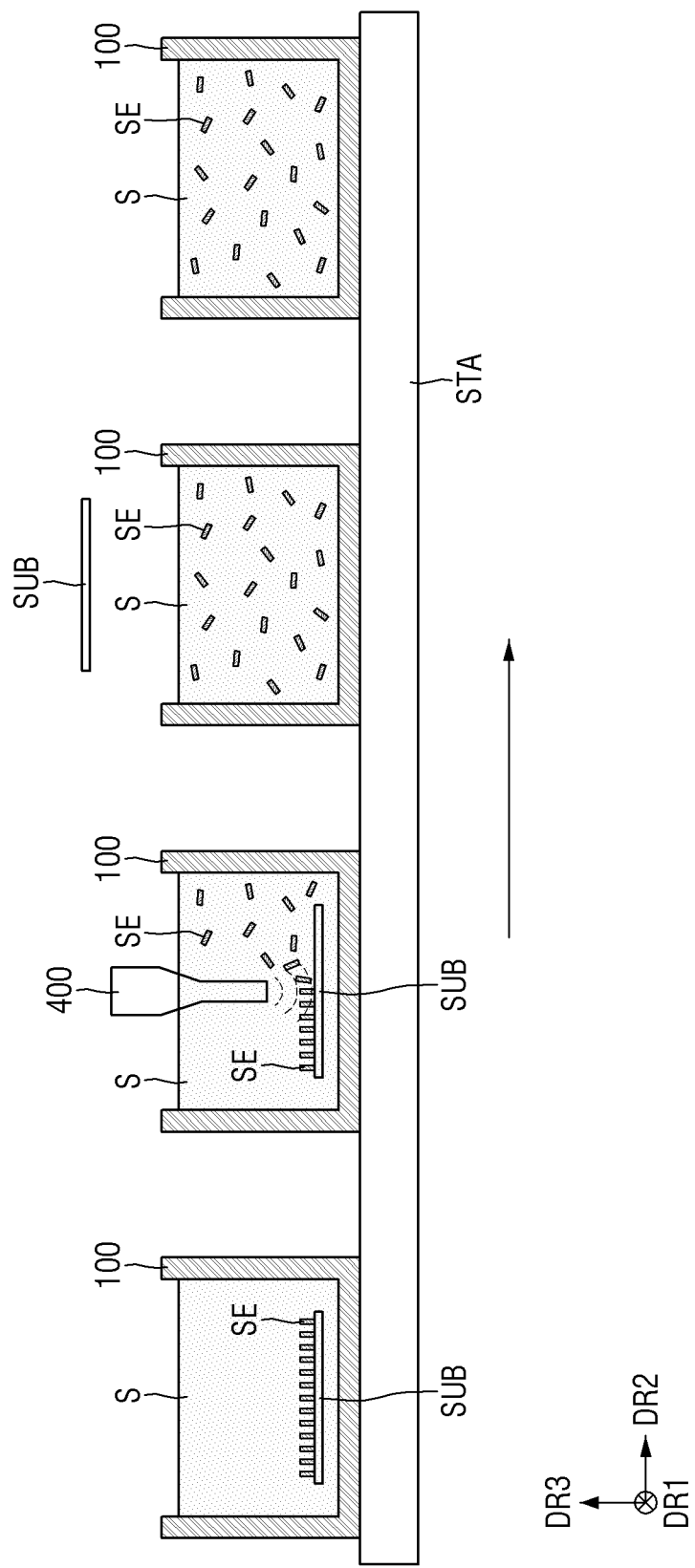
FIGS. 37 and 38 are schematic cross-sectional views showing some or a number of the processing steps of a method of fabricating the light-emitting element of FIG. 36.
Figure 38:
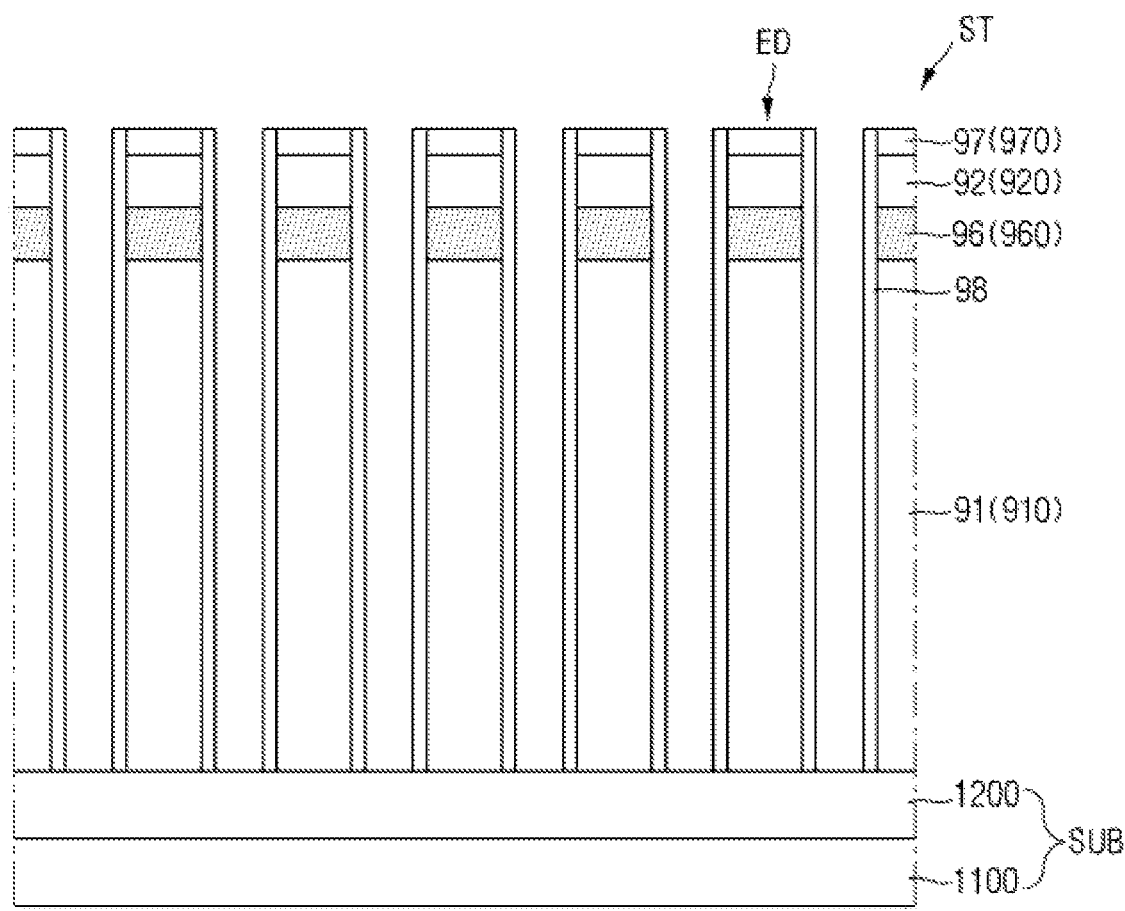

FIGS. 37 and 38 are schematic cross-sectional views showing some or a number of the processing steps of a method of fabricating the light-emitting element of FIG. 36.

Referring to FIGS. 37 and 38, a plurality of light-emitting diodes ED may be formed by stacking semiconductor layers on the substrate SUB to form a semiconductor structure ST, and then etching it in the direction perpendicular to a surface of the substrate SUB.

Initially, a substrate SUB including a support substrate 1100 and a buffer layer 1200 is prepared, and a semiconductor structure ST is formed thereon, in which a plurality of semiconductor layers may be stacked on one another. As described above, the support substrate 1100 may be a sapphire substrate ($Al_2O_3$) and a substrate such as glass, or may be formed of a conductive substrate such as GaN, SiC, ZnO, Si, GaP and GaAs. The buffer layer 1200 may be disposed in order to reduce a difference in lattice constant between the support substrate 1100 and the semiconductor layers disposed thereon.

The semiconductor structure ST may include semiconductor material layers 910, 920, 960 and 970 made of substantially the same or similar material as the semiconductor layers of the light-emitting diode ED. The semiconductor structure ST may have a structure in which the semiconductor material layers 910, 920 and 960 grown by the epitaxial growth and an electrode layer 970 may be sequentially stacked on the buffer layer 1200.

Subsequently, the semiconductor structure ST may be etched in the direction perpendicular to the upper surface of the substrate SUB, such that rods may be formed. Then, an insulating layer 98 surrounding the side surfaces of the rods may be formed, so that light-emitting diodes ED may be formed. The light-emitting diodes ED may be formed on the surface of the substrate SUB, including the plurality of semiconductor layers 91, 92 and 96, the electrode layer 97 and the insulating layer 98 surrounding side surfaces thereof. The light-emitting diodes ED formed on the substrate SUB by the epitaxial growth as described above may be fabricated via a process of separating them from the substrate SUB using the apparatus 10 of FIG. 1. In a case that the first semiconductor layer 91 of each of the light-emitting diodes ED is separated from the buffer layer 1200 of the substrate SUB, the separation surface may be formed neatly or uniformly through separation using ultrasonic waves SN, and thus deviations in length among the plurality of light-emitting diodes ED may be reduced.

It is to be noted that the shape and material of the light-emitting diodes ED are not limited to those described with reference to FIG. 36. In embodiments, the light-emitting diodes ED may have a different shape.

Figure 39:
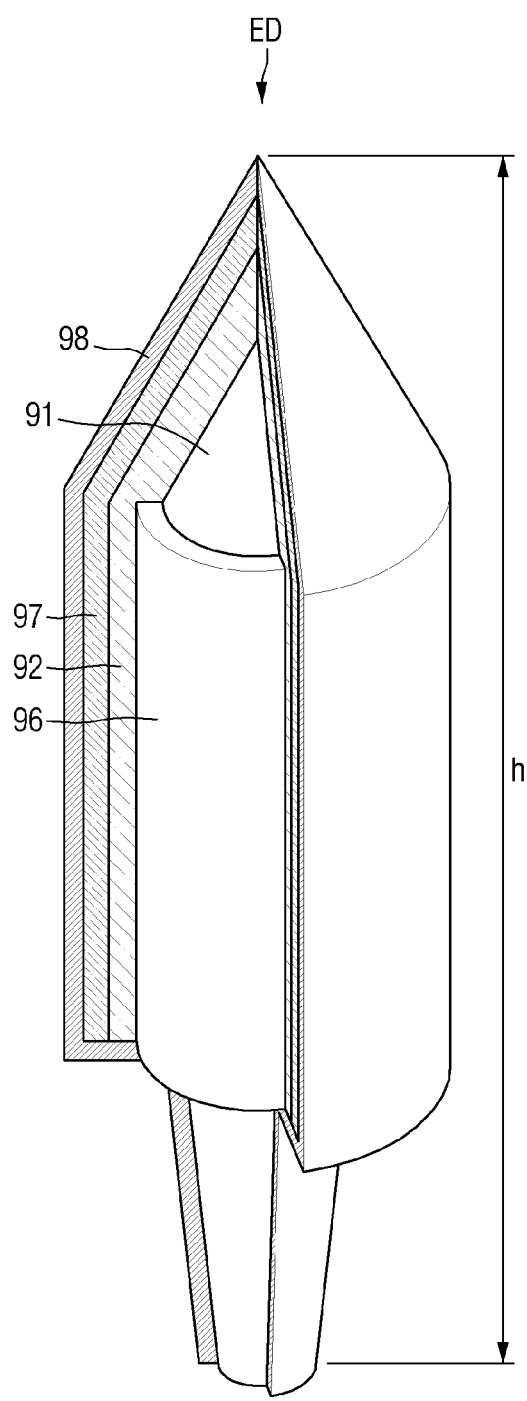
FIG. 39 is a view showing a light-emitting element according to an embodiment.

FIG. 39 is a view showing a light-emitting element according to an embodiment.

Referring to FIG. 39, a light-emitting diode ED may have a shape extended in one direction, with a partially inclined side surface. The light-emitting diode ED according to an embodiment may have a partially conical shape.

The light-emitting diode ED may be formed with a plurality of layers one surrounding another, instead of a plurality of layers stacked on one another in a direction. The light-emitting diode ED may include a semiconductor core that may be at least partially extended in a direction, and an insulating layer 98 formed or disposed to surround the semiconductor core. The semiconductor core may include a first semiconductor layer 91, an emissive layer 96, a second semiconductor layer 92, and an electrode layer 97.

The first semiconductor layer 91 may be extended in a direction and may have both ends thereof inclined toward the center. The first semiconductor layer 91 may have a substantially rod-like or cylindrical body, and upper and lower ends on the top and bottom of the body, respectively, with inclined side surfaces. The upper end of the body may have a steeper slope than the lower end.

The emissive layer 96 may be disposed to surround the outer surface of the body of the first semiconductor layer 91. The emissive layer 96 may have a substantially annular shape extended in one direction. The emissive layer 96 may not be formed on the upper and lower ends of the first semiconductor layer 91. It is, however, to be understood that the disclosure is not limited thereto. Light emitted from the emissive layer 96 may exit not only through the both ends of the light-emitting diode ED in the longitudinal direction, but also through both side surfaces of the light-emitting diode ED. Compared to the light-emitting diode ED of FIG. 36, the light-emitting diode ED of FIG. 39 may have a larger area of the emissive layer 96 and thus may emit a greater amount of light.

The second semiconductor layer 92 may be disposed to surround the outer surface of the emissive layer 96 and the upper end of the first semiconductor layer 91. The second semiconductor layer 92 may include an annular body extended in one direction and an upper end having an inclined side surface. The second semiconductor layer 92 may be in direct electrical contact with the parallel side surfaces of the emissive layer 96 and the inclined upper end of the first semiconductor layer 91. It is to be noted that the second semiconductor layer 92 may not be formed on the lower end of the first semiconductor layer 91.

The electrode layer 97 may be disposed to surround the outer surface of the second semiconductor layer 92. The electrode layer 97 may have substantially the same shape as the second semiconductor layer 92. The electrode layer 97 may be in electrical contact with the entire outer surface of the second semiconductor layer 92.

The insulating layer 98 may be disposed to surround outer surfaces of the electrode layer 97 and the first semiconductor layer 91. The insulating layer 98 may include the electrode layer 97 and may be in direct contact with the lower end of the first semiconductor layer 91 and the exposed lower ends of the emissive layer 96 and the second semiconductor layer 92.

Different from an embodiment of FIG. 36, the light-emitting diode ED of FIG. 39 may be formed via a process of depositing one semiconductor layer to surround another semiconductor layer.

Figure 40:
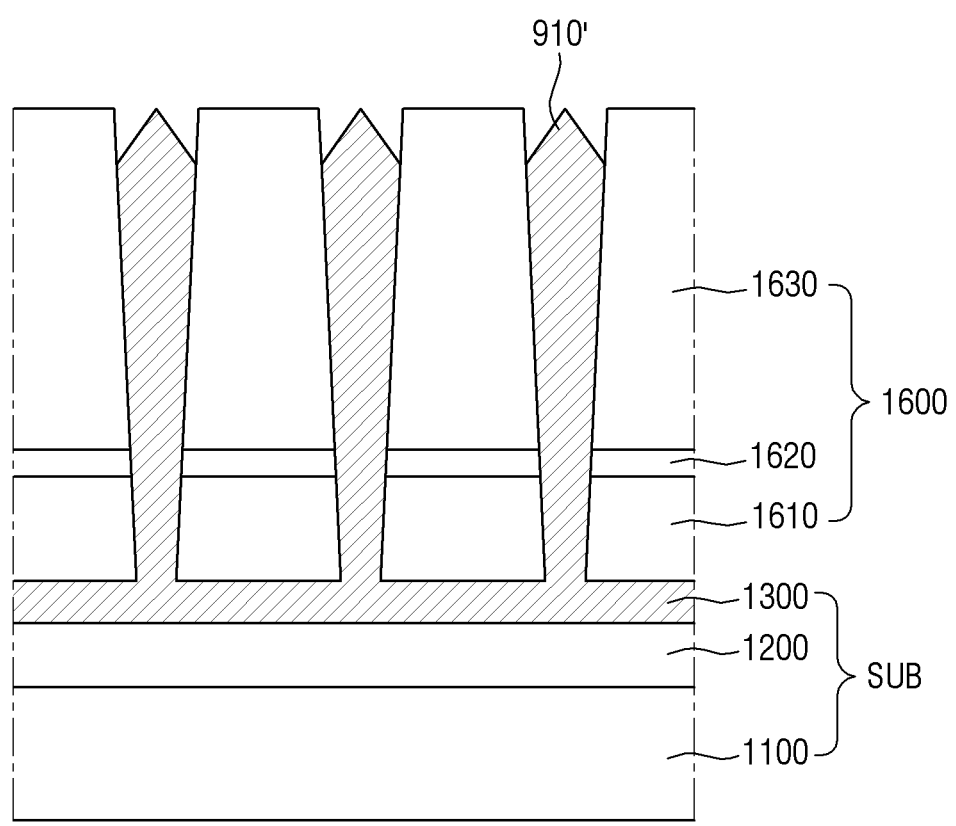
FIGS. 40 to 42 are schematic cross-sectional views showing some or a number of the processing steps of a method of fabricating the light-emitting element or diode of FIG. 39.
Figure 41:
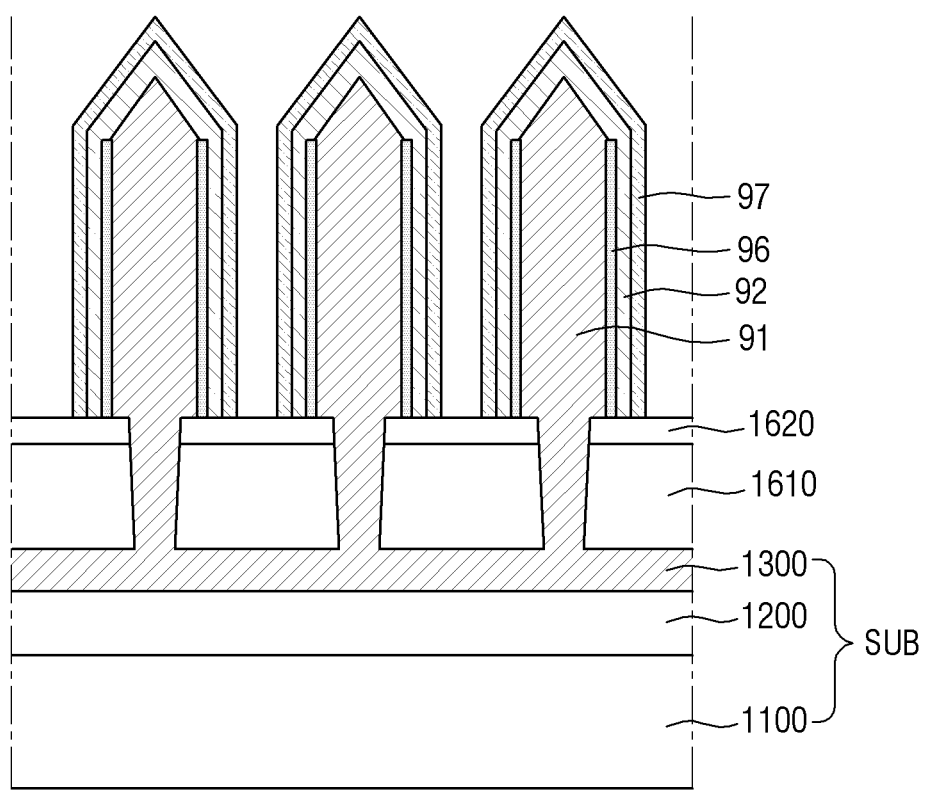
Figure 42:
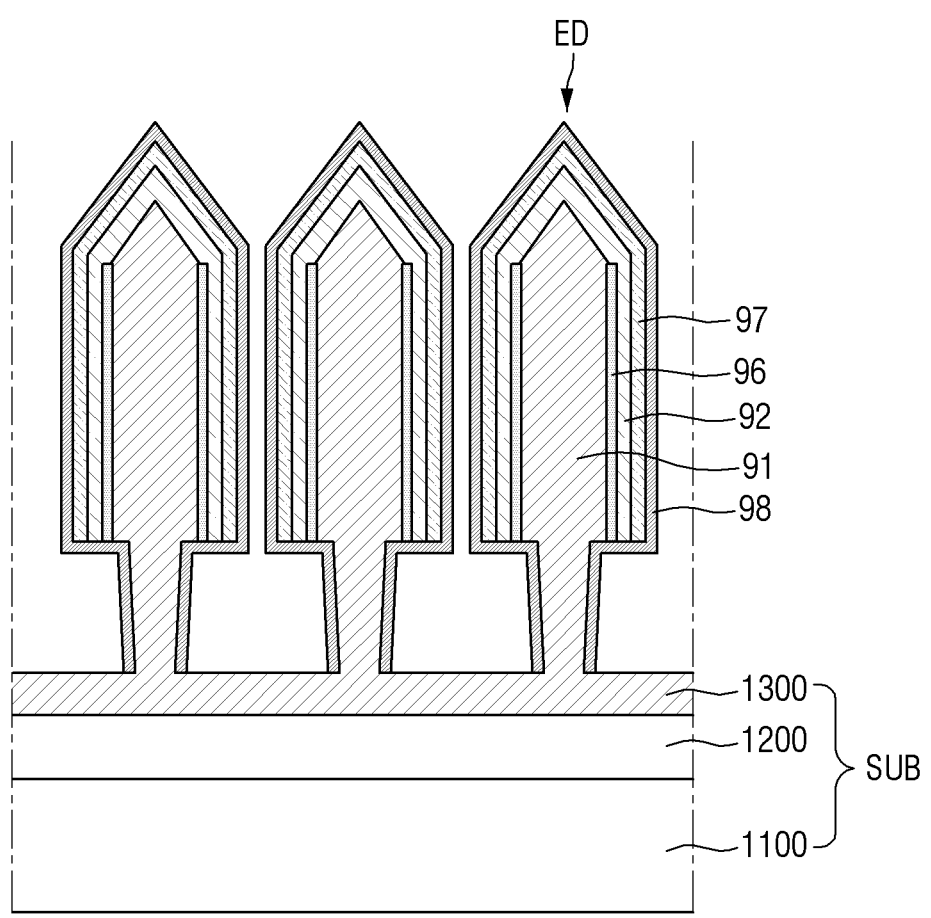

FIGS. 40 to 42 are schematic cross-sectional views showing some or a number of the processing steps of a method of fabricating the light-emitting diode of FIG. 39.

First, referring to FIG. 40, the substrate SUB may include a support substrate 1100, a buffer layer 1200, and a sub-semiconductor layer 1300. A mask layer 1600 including etch holes may be disposed on the sub-semiconductor layer 1300. The sub-semiconductor layer 1300 may provide a seed crystal of a first semiconductor portion 910' grown thereon.

The mask layer 1600 may include a first mask layer 1610, a second mask layer 1620, and a third mask layer 1630. The etch holes of the mask layer 1600 may form spaces in which the first semiconductor portion 910' may be grown from the sub-semiconductor layer 1300. The etch holes may have a shape that increases in width from the first mask layer 1610 to the third mask layer 1630. The first semiconductor portion 910' grown in the etch holes may have inclined side surfaces.

Subsequently, referring to FIG. 41, the third mask layer 1630 of the mask layer 1600 may be removed. The side surfaces of the first semiconductor portion 910' may be planarized perpendicular to the upper surface of the substrate SUB, so that a first semiconductor layer 91 may be formed, and an emissive layer 96, a second semiconductor layer 92, and an electrode layer 97 surrounding the outer surface of the first semiconductor layer 91 are formed. The emissive layer 96, the second semiconductor layer 92 and the electrode layer 97 may be formed only on the outer surfaces of the exposed portions of the first semiconductor layer 91 above the second mask layer 1620. Only the first semiconductor layer 91 may be formed which may not be exposed by the first mask layer 1610 and the second mask layer 1620.

Subsequently, referring to FIG. 42, the first mask layer 1610 and the second mask layer 1620 may be removed, and then the insulating layer 98 surrounding the outer surfaces of the first semiconductor layer 91, the emissive layer 96, the second semiconductor layer 92 and the electrode layer 97 may be formed. In this manner, the light-emitting diodes ED may be formed on the substrate SUB. In the method of fabricating the light-emitting diodes ED according to embodiment, the semiconductor layers may be formed sequentially on the substrate SUB, different from the light-emitting diode ED of FIG. 36, which may be formed by forming the semiconductor structure ST and then etching it.

Subsequently, although not shown in the drawings, the light-emitting diodes ED formed on the substrate SUB may be separated using the apparatus 10 for separating semiconductor elements. The first semiconductor layer 91 of each of the light-emitting diodes ED shown in FIG. 38 may be integrated with the sub-semiconductor layer 1300 disposed on the substrate SUB, and it may be separated neatly or uniformly by using ultrasonic waves SN.

In concluding the detailed description, those skilled in the art will appreciate that many variations and modifications may be made to the embodiments without substantially departing from the principles of the disclosure. Therefore, the disclosed embodiments are used in a generic and descriptive sense only and not for purposes of limitation.

What is claimed is:

1. An apparatus comprising:
   a base comprising a receiving portion that receives a solvent and a substrate on which semiconductor elements are disposed; and
   at least one ultrasonic generator that generates and applies ultrasonic waves to the substrate placed in the base, wherein
   the base comprises sidewalls surrounding the receiving portion,
   the at least one ultrasonic generator further comprises:
      second ultrasonic generators disposed on sidewalls of the base in a first direction; and
      third ultrasonic generators disposed on sidewalls of the base in a second direction in a plan view, and
   the second ultrasonic generators and the third ultrasonic generators generate ultrasonic waves in a direction horizontal to the lower surface of the base.

2. The apparatus of claim 1, wherein
   the at least one ultrasonic generator comprises a first ultrasonic generator disposed at a bottom of the base, and
   the first ultrasonic generator generates ultrasonic waves in a direction perpendicular to a lower surface of the receiving portion of the base.

3. The apparatus of claim 2, wherein
   the bottom of the base comprises:
      a portion on which the first ultrasonic generator is disposed; and
      an inclined portion connecting the portion on which the first ultrasonic generator is disposed with a sidewall, and
   the at least one ultrasonic generator further comprises a fourth ultrasonic generator disposed on the inclined portion of the base.

4. An apparatus comprising:
   a base comprising a receiving portion that receives a substrate on which semiconductor elements are disposed; and
   at least one ultrasonic generator that generates and applies ultrasonic waves to the substrate placed in the base, wherein
   the at least one ultrasonic generator comprises a first ultrasonic generator disposed at a bottom of the base,
   the first ultrasonic generator generates ultrasonic waves in a direction perpendicular to a lower surface of the receiving portion of the base, and
   the at least one ultrasonic generator further comprises fifth ultrasonic generators disposed in the receiving portion of the base.

5. The apparatus of claim 1, wherein
   the at least one ultrasonic generator is a probe ultrasonic generator that selectively generates and applies ultrasonic waves to a number of regions of the substrate, the probe ultrasonic generator being separated from the base, and
   the probe ultrasonic generator generates and applies ultrasonic waves in a direction perpendicular to a surface of the substrate on which the semiconductor elements are formed.

6. The apparatus of claim 5, wherein the probe ultrasonic generator moves in at least one direction on the base.

7. An apparatus comprising:
   a base comprising a receiving portion that receives a substrate on which semiconductor elements are disposed; and
   at least one ultrasonic generator that generates and applies ultrasonic waves to the substrate placed in the base;
   a stage on which the base is disposed, wherein
   the at least one ultrasonic generator comprises a first ultrasonic generator disposed at a bottom of the base,
   the first ultrasonic generator generates ultrasonic waves in a direction perpendicular to a lower surface of the receiving portion of the base,
   the at least one ultrasonic generator is a probe ultrasonic generator that selectively generates and applies ultrasonic waves to a number of regions of the substrate, the probe ultrasonic generator being separated from the base,
   the probe ultrasonic generator generates and applies ultrasonic waves in a direction perpendicular to a surface of the substrate on which the semiconductor elements are formed,
   a gantry unit on which the probe ultrasonic generator is disposed above the stage, and
   the probe ultrasonic generator generates and applies ultrasonic waves to the substrate while the base is moving on the stage.

8. The apparatus of claim 1, further comprising:
   a first inlet pipe connected to a side of the receiving portion of the base, and;
   a second inlet pipe connected to another side of the receiving portion of the base, wherein
   the first inlet pipe introduces the solvent into the receiving portion of the base, and
   the second inlet pipe discharges the solvent and the semiconductor elements.

9. The apparatus of claim 8, further comprising:
a filter part connected to the first inlet pipe and the second inlet pipe;
a first filter disposed between the filter part and the first inlet pipe; and
a second filter disposed between the filter part and the second inlet pipe,
wherein the first filter filters out particles of a smaller size than particles that the second filter filters.

10. The apparatus of claim 9, further comprising:
a valve connected to the filter part to discharge the solvent and the semiconductor elements introduced into the filter part.

11. The apparatus of claim 1, further comprising:
a measurement unit that measures a degree of separation from the substrate from which the semiconductor elements have been separated.

12. The apparatus of claim 1, wherein
the semiconductor elements are inorganic light emitting diodes epitaxially grown on the substrate; and
the at least one ultrasonic generator to separate the semiconductor elements from the substrate by physical force generated by cavitation energy from the ultrasonic waves.

13. The apparatus of claim 1, wherein the solvent is a material that does not react with the semiconductor elements.

14. The apparatus of claim 4, wherein
the first ultrasonic generator is arranged on an exterior of the base, and
each of the fifth ultrasonic generators are spaced apart from the first ultrasonic generator.

* * * * *